(12) United States Patent
Muraoka et al.

(10) Patent No.: US 6,851,873 B2
(45) Date of Patent: Feb. 8, 2005

(54) METHOD AND APPARATUS FOR REMOVING ORGANIC FILMS

(75) Inventors: Hisashi Muraoka, Yokohama (JP); Rieko Muraoka, Yokohama (JP); Asuka Sato, Yokohama (JP); Mitsuru Endo, Yokohama (JP)

(73) Assignees: Nomura Micro Science Co., Ltd., Atsugi (JP); UMS Co., Ltd., Yokohama (JP)

(*) Notice: Subject to any disclaimer, the term of this patent is extended or adjusted under 35 U.S.C. 154(b) by 0 days.

(21) Appl. No.: 10/683,288

(22) Filed: Oct. 14, 2003

(65) Prior Publication Data

US 2004/0076912 A1 Apr. 22, 2004

Related U.S. Application Data

(62) Division of application No. 10/274,153, filed on Oct. 21, 2002, now Pat. No. 6,696,228.

(30) Foreign Application Priority Data

| Oct. 23, 2001 | (JP) | ........... 2001-325516 |
| Mar. 6, 2002 | (JP) | ........... 2002-061096 |
| Aug. 7, 2002 | (JP) | ........... 2002-229394 |

(51) Int. Cl.$^7$ .............................. G03D 5/00
(52) U.S. Cl. .............. 396/611; 396/626; 396/627; 134/1; 134/10; 134/11; 134/38; 156/651; 430/329; 438/723
(58) Field of Search ................. 396/604, 611, 396/627; 134/1, 10, 11, 38, 109, 122; 430/329; 438/723; 156/651

(56) References Cited

U.S. PATENT DOCUMENTS

| 5,350,489 A | 9/1994 | Muraoka ............... 156/651 |
| 5,690,747 A | * 11/1997 | Doscher ............... 134/1 |
| 6,645,874 B1 | * 11/2003 | Torek et al. .......... 438/723 |

* cited by examiner

*Primary Examiner*—D. Rutledge
(74) *Attorney, Agent, or Firm*—Oblon, Spivak, McClelland, Maier & Neustadt, P.C.

(57) ABSTRACT

A method and an apparatus for removing an organic film, such as a resist film, from a substrate surface are provided wherein a treatment liquid containing dissolved ozone, and preferably formed from liquid ethylene or propylene carbonate, or both, is contacted with the substrate having the organic film, and the organic film removed, wherein the apparatus contains (A) a treatment liquid delivery device, (B) a film contact device, (C) a liquid circulation device and (D) an ozone dissolution device.

12 Claims, 7 Drawing Sheets

METHOD AND APPARATUS FOR REMOVING ORGANIC FILMS

BACKGROUND OF THE INVENTION

1. Field of the Invention

The present invention relates to a method of removing an organic film adhered to a substrate, enabling the surface of an electronic device substrate or the like to be cleaned, and also relates to an organic film removal apparatus and a resist film removal reagent. In particular the invention relates to the removal of photoresist films used during the processing of semiconductor wafers or liquid crystal substrates. Furthermore, the invention also relates to the removal of organic contaminant films or fine particles from such substrates. In addition, the present invention can also be applied to the removal of more typical organic films such as oil films or paint films from a substrate.

2. Description of the Prior Art

The removal of photoresists used during the ultra fine processing of oxide films or polysilicon films typically employs a method wherein the substrate is immersed in a mixed solution of sulfuric acid (3 or 4 parts by volume) and hydrogen peroxide (1 part by volume) (known as piranha) and heated at 110 to 140° C. for 10 to 20 minutes. In those cases in which a high concentration ion implantation has been performed using a resist mask, the resist itself degenerates and cannot be easily removed using a piranha solution, and consequently ashing with plasma excited oxygen is typically employed. Resists which have suffered surface degeneration following dry etching are also removed in this manner. However, if an entire photoresist is subjected to ashing, organic decomposition residues, fine particles and minute quantities of metal derived from the resist remain, and films of decomposed material also remain on the side walls of channels which have undergone processing. In addition, because the ashing process requires a high energy plasma, the surface of the wafer is also exposed to damage which could harm a semiconductor device. Consequently, ashing is typically performed so that a minute quantity of the resist film remains, and this residual resist is subsequently removed using either piranha treatment, or treatment with an organic solvent such as n-methylpyrolidone (NMP), dimethylsulfoxide (DMSO) or an amine in the case of a metal wiring film process.

Piranha treatment discharges large quantities of sulfuric acid, and similarly treatments which use organic solvents also consume large quantities of solvent, and consequently both types of treatment cause large environmental problems. As a result, resist removal using ozone water has recently been tested. The solubility of ozone in water increases as the temperature is lowered, and if a gas containing a high concentration of ozone (hereafter referred to as ozone gas) is used, then the solubility of ozone in cold water of approximately 0° C. reaches 70 to 100 ppm. However, with this type of ozone water treatment, the stripping rate for a novolak resin based positive resist film used with i-line radiation, which is a widely used configuration in LSI production, is slow, at not more than 0.1 μm/minute, meaning the treatment is not entirely practical. Recently, methods involving treatment with a combination of a high concentration ozone gas and water vapor, and methods involving treatment with a high concentration ozone water utilizing pressurized ozone have also been developed, but the stripping rates with these methods is still slow at approximately 1 μm/minute, and in the case of a substrate comprising a metal wiring film of Cu, W or Mo or the like, damage to the film also becomes a problem.

Regardless of whether piranha treatment or organic solvent treatment is used, from a productivity perspective, the process involves the treatment of a plurality of wafer containing carriers which are inserted in a liquid contained within a cleaning vessel. In the former treatment, hydrogen peroxide decomposes forming water, and the solution gradually becomes diluted, requiring the addition of more hydrogen peroxide, although there is a limit to the amount of additional hydrogen peroxide that can be added. Accordingly, the usable lifespan of the chemical solution in the cleaning vessel is surprisingly short, and large volumes of sulfuric acid need to be discharged, resulting in considerable costs associated with environmental measures. In the case of the latter treatment, repeated use results in an accumulation of dissolved resist within the solvent, which leads to an increase in reverse contamination of the wafer and places a larger load on the rinse solution. Accordingly, the solvent within the cleaning vessel needs to be changed quite regularly. Certainly, neither treatment can be claimed to be economical.

Resists which have undergone strong dry etching or high concentration ion implantation and have suffered considerable degeneration are impossible to remove using conventional wet treatments, and these types of resists are currently removed using ashing methods. However as described above, ashing has a considerable number of associated problems, and also requires a subsequent wet treatment.

In a wet treatment using an organic solvent, metal impurities within the resist migrate into the treatment liquid, and as the treatment liquid is used repeatedly the concentration within the liquid of metal derived from the resist increases. If this metal is a metal with a larger oxide formation enthalpy than silicon, such as iron, zinc or aluminum, then there is a danger of substitution via Si—O linkages occurring at the resist removal surface, resulting in contamination of the surface.

Furthermore, resist removal using organic solvents is used almost exclusively in cases in which the substrate is a metal wiring film. Removal solvents with a strong stripping performance typically contain an amine, and if a rinse with pure water is performed immediately after treatment then strongly alkaline sections are generated, and there is a considerable danger of damage being caused to the metal film of the substrate. Accordingly, the treatment solvent is exchanged with isopropyl alcohol prior to rinsing with pure water, making increases in the organic solvent consumption unavoidable.

A photoresist stripping liquid composition formed from 4-methoxy-1-butanol, 3-methoxy-1-butanol or a mixture of 4- methoxy-1-butanol and 3-methoxy-1-butanol, together with propylene carbonate is disclosed in Japanese Patent Publication No. 2679618 (JP 2679618 B), although no mention is made of the use of only propylene carbonate, and similarly no mention is made of ozone use.

Furthermore, U.S. Pat. No. 5,690,747 discloses a method for removing a photoresist in an ultrasonically agitated solvent comprising (a) 40 to 50 vol % of an aprotic cyclic carbonate ester such as ethylene carbonate, (b) an aprotic polar compound such as ethylene diacetate and ethylene dibutyrate, as well as the solvents N-methyl-2-pyrrolidone and triethanolamine. In addition, the cleaning effect of ethylene carbonate and propylene carbonate on ink and the like has also been reported. However, there have been no reports regarding the use of only ethylene carbonate or propylene carbonate for photoresist removal, nor on their combined use with ozone.

SUMMARY OF THE INVENTION

An object of the present invention is to provide a method and an apparatus for effectively removing not only resists, but also other organic films such as oil films and paint films, which are capable of achieving an extremely rapid stripping rate of 20 µm/minute for a typical resist film, and are also capable of removing even resist films which have undergone considerable degeneration as a result of ion implantation or the like at a satisfactorily productive stripping rate of several µm/min, and which moreover do not damage the surface of the substrate beneath the film, do not suffer from the types of environmental problems described above, and are extremely economical.

A first aspect of the present invention provides a method for removing an organic film on a surface of a substrate, comprising:

bringing a treatment liquid comprising liquid ethylene carbonate, propylene carbonate, or both of them into contact with said substrate to remove said organic film, thereby allowing material constituting said organic film to migrate into said treatment liquid, decomposing said material in said treatment liquid into low molecular weight material by ozone, thereby said ozone treated treatment liquid being regenerated as a treatment liquid, and recycling the treatment liquid thus regenerated for treating another substrate.

A second aspect of the present invention provides a method for removing an organic film on a surface of a substrate, comprising:

bringing a treatment liquid containing ozone dissolved in a liquid comprising ethylene carbonate, propylene carbonate, or both of them into contact with said substrate with an organic film on a surface thereof to remove said organic film, wherein said organic film is dissolved said treatment liquid and decomposed into low molecular weight material, and using the treatment liquid after removal of said organic film for treating another substrate.

In a preferred embodiment of the second aspect of the present invention, said treatment liquid after removal of said organic film is recycled as a treatment liquid as it is for treating another substrate.

In another preferred embodiment of the second aspect of the present invention, said treatment liquid after removal of said organic film is further subjected to treatment with ozone, and then recycled as a treatment liquid for treating another substrate.

A third aspect of the present invention provides an apparatus for removing an organic film from a surface of a substrate comprising:

(A) a treatment liquid delivery means for transporting a treatment liquid comprising liquid ethylene carbonate, propylene carbonate, or both thereof to a treatment area, (B) a film contact means for bringing the treatment liquid into contact with the surface of said organic film of the substrate within the treatment area, (C) a treatment liquid circulation means for recycling treatment liquid used and discharged from the treatment area back to said treatment area via one or more temporary storage means, and (D) an ozone-containing gas contact means for bringing an ozone-containing gas into contact with the treatment liquid discharged from said treatment area within said treatment area and/or within at least one of said temporary storage means.

DETAILED DESCRIPTION OF THE PREFERRED EMBODIMENTS

Figure 1:
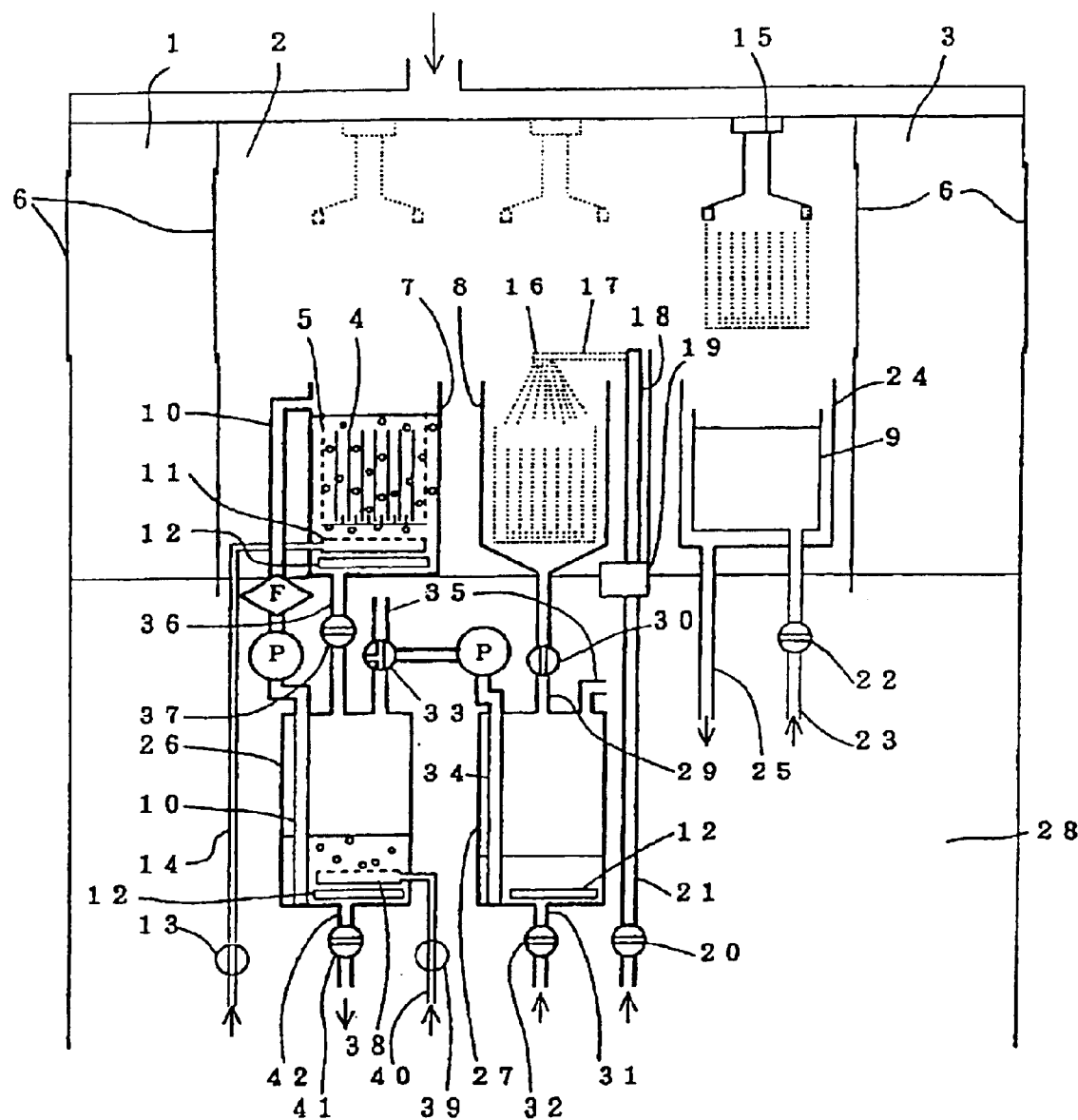
FIG. 1 is a schematic longitudinal sectional view of an apparatus employing the present invention in the immersion of a wafer requiring treatment.

As follows is a more detailed description of the present invention.

The major characteristic of the present invention is the use of a previously untested ethylene carbonate and/or propylene carbonate treatment using ozone, for the stripping and removal of resist films and the like. (Hereafter, the term "alkylene carbonate" may be used to describe "ethylene carbonate and/or propylene carbonate". Similarly, the term "alkylene carbonate treatment" may be used to describe "ethylene carbonate and/or propylene carbonate treatment").

[Treatment Liquid]

Ethylene carbonate (melting point 36.4° C., boiling point 238° C., flash point 160° C.) is readily soluble in water, and at room temperature is a comparatively stable colorless, odorless solid, although upon heating it becomes a liquid and can be used as an aprotic, polar solvent. The fact that the boiling point and the flash point are high, and the toxicity is low, together with the fact that it is not classified as a hazardous material under the Fire Services Act, makes ethylene carbonate a preferred solvent. Propylene carbonate (melting point −48.8° C., boiling point 242° C., flash point 130° C. or higher) is a liquid at low temperatures, and with the exception of being classified as a type 4 hazardous material, is a solvent with similar properties to ethylene carbonate.

These alkylene carbonate liquids have a powerful solvency action with respect to aromatic hydrocarbons, although the solubility parameter (SP value), derived from the molecular cohesive energy density, is large at approximately 14. In theory, the closer the SP values match, the better the solubility becomes, and as the SP value of the polymers used as resist materials are typically around 10, the use of stripping solvents with similar SP values, such as NMP which has an SP value of 11, has become widespread. However, the inventors of the present invention have discovered that alkylene carbonate liquid, by itself, when heated displays a similar or even superior stripping performance to conventional stripping solvents.

This alkylene carbonate liquid is a polar solvent, and consequently the solubility of ozone is poor. However, even at low concentrations, the ozone incorporated within an alkylene carbonate liquid displays a powerful decomposition effect on dissolved organic material (particularly, compounds with double bond linkages or aromatic compounds), although the inventors of the present invention discovered that the alkylene carbonate itself displays only slight reactivity with ozone at low temperatures, and consequently decomposition of the alkylene carbonate by the ozone is comparatively slight. Reaction between an alkylene carbonate and ozone generates oxidizing materials (thought to be peroxides), although ethylene carbonate liquid displays less reactivity towards ozone than propylene carbonate, and when ethylene carbonate liquid at 40° C. was saturated with 250 mg/L of ozone gas for 5 minutes, the generation of oxidizing materials amounted to not more than 15 mg equivalent/L.

The solvency action of alkylene carbonate liquid on an organic film increases with increasing temperature. Provided the temperature is below the flash point, the treatment operation can be performed safely, and if the treatment operation is performed in an inert gas atmosphere, then there are no problems with performing a wet treatment at a temperature of approximately 200° C. Furthermore, the vapor pressure of alkylene carbonate at 70° C. is approximately 1/10th that of other organic solvent based resist removal reagents, offering the advantage that liquid loss through evaporation under heating is far lower. At high temperatures, this evaporation loss increases slightly, but the toxicity of the vapor is extremely low, meaning the evaporation is not a significant problem. In the present invention, because the use of ozone gas with alkylene carbonate proves very effective, where necessary, a draft may also be used.

The treatment liquid is easier to handle if it exists as a liquid at room temperature. If ethylene carbonate and propylene carbonate are mixed together, then increasing the amount of the latter lowers the melting point. However as described above, increasing the amount of the latter also increases the amount of oxidizing materials generated through reaction with ozone, in those cases where ozone is dissolved in the liquid, which has an effect on the consumption of the liquid. The mixture ratio which best satisfies the requirement for a room temperature liquid, while suppressing the generation of oxidizing materials is a weight ratio of ethylene carbonate/propylene carbonate within a range from 4 to 2/3, and preferably from 3 to 1.

[Organic Film Removal Performance of Treatment Liquid]

A novolak type resist, which is a typically representative positive type photoresist, comprises a cresol polymer and a polycyclic aromatic, and if such a photoresist is treated with a treatment liquid of the present invention, then the solubility increases with heating, and furthermore by dissolving ozone in the liquid a decomposition reaction can be initiated, meaning this type of film can be effectively stripped and removed. The effective temperature range for a treatment liquid with no dissolved ozone, using only heat, is 30 to 200° C. (40 to 200° C. in the case of solely ethylene carbonate), and temperatures of 60 to 150° C., which remains below the flash point, are preferred. If the treatment conditions are suitable, then stripping rates of 20 $\mu$m/min or greater are easily achievable. In cases in which stripping is performed using a treatment liquid which has been aerated with ozone gas, liquid temperatures of 20 to 60° C. are desirable. The effect of ozone is a particular feature of the present invention, and as such, treatment using ozone is described separately.

Even novolak resist film which has decomposed under ion implantation of $B^+$ at $1\times10^{15}$ ions/cm$^2$, and has proved extremely difficult to remove by conventional wet stripping methods can be removed in a reasonably short time using immersion treatment in a high temperature alkylene carbonate liquid. For example, a film of thickness 1.5 $\mu$m can be removed by a 70 second immersion treatment in alkylene carbonate at 120° C. Resists with a decomposed layer produced by dry etching can also be removed in a similar manner. Furthermore, the higher the treatment temperature becomes, the lower the surface tension and viscosity becomes, making high temperature treatment suitable for the resist stripping of devices with ultra fine patterns. In the case of immersion treatment at 120° C., the elution rate of a metal wiring film of Al, Cu or W or the like is not more than 0.003 nm/minute. Consequently, the stripping of resists on metal films can be conducted without damaging the films. The reason for this characteristic is that the alkylene carbonate liquid is neutral. Of course, by performing the subsequent rinse treatment with pure water, the film remains undamaged. In this manner, an alkylene carbonate liquid is chemically totally safe with respect to the substrate material, and yet also exhibits a powerful resist stripping effect, providing a combination of characteristics which has been unobtainable with conventional organic solvent based resist stripping reagents.

For a film with ion implantation of $B^+$ at $1\times10^{14}$ ions/cm$^2$, stripping of a thickness of 1.5 $\mu$m is extremely fast, requiring only 5 seconds (a stripping rate of 18 $\mu$m/minute) on immersion in ethylene carbonate liquid at 120° C., and 10 seconds (a stripping rate of 9 $\mu$m/minute) on immersion in ethylene carbonate liquid at 100° C. In the case of propylene carbonate, the time taken is slightly longer. In the high temperature treatment of a resist that has undergone considerable degeneration, a stripping mechanism operates wherein the components of the resist other than the surface layer which has undergone considerable decomposition are dissolved readily in the treatment liquid, while the decomposed components which are more difficult to dissolve are dispersed within the treatment liquid as fine particles. The fact that, as described below, these dispersed fine particles can be completely dissolved by subsequent ozone gas treatment, following a reduction in the temperature of the alkylene carbonate liquid, is a characteristic of the present invention.

Because the solvency action at this high temperature is extremely powerful, just bringing a liquid film of treatment liquid of thickness 10 to 100 $\mu$m in contact with an organic film on a substrate causes dissolution to begin immediately. Because the dissolution process is a type of diffusion phenomenon which accelerates with increasing concentration difference, by forming a liquid film on the surface of the object undergoing treatment, and then continuously or intermittently supplying fresh treatment liquid to the liquid film and moving the liquid, the dissolution effect can be further improved. Accordingly in those cases in which the substrate is a wafer shape, this method can even be applied to a single wafer spin processing in which the treatment liquid is supplied through a nozzle, or shower treatment onto a sloped surface.

Furthermore, oil films such as dioctyl phthalate (DOP) which represents a major organic contaminant film on wafer surfaces can also be dissolved using high temperature treatment, and fine contaminant particles adhered to the surface through these oil films can also be removed at the same time. Oil films of polyethylene glycol based water soluble processing oils left on the surface of articles following mechanical processing can also be removed using a similar treatment. Alkylene carbonates display good solvency of a wide range of synthetic polymers, and as described above have a large SP value, and are consequently ideal for the removal of paint films made of epoxy resins, alkyd resins or the like with comparatively high SP values, formed on metal surfaces. In such cases, because the treatment liquid is neutral, the surface of the mild steel, stainless steel or brass of the substrate is undamaged, even if the stripping treatment is conducted at a high temperature.

During the removal of a film on a substrate by a liquid treatment, by irradiating high frequency ultrasound (so-called megasonic) of a frequency from 0.7 to 2 MHz, and preferably approximately 1 MHz, through the liquid, substrate damage arising from cavitation can be suppressed, and the chemical action of the liquid is amplified through highly accelerated molecular agitation. The vapor pressure of alkylene carbonate, even at 100° C., is not more than 10 mm Hg, meaning megasonic agitation is possible at this temperature without the formation of gas bubbles. By employing this treatment, the stripping performance of the treatment liquid can be enhanced markedly. For the $B^+$ $1 \times 10^{15}$ ions/cm$^2$ ion implantation film described above, removal can be achieved by a 1 minute immersion treatment in ethylene carbonate at 100° C., and an acrylic resin based paint film with a slightly smaller SP value can be removed at 80° C. The same effects can be achieved via a method in which the alkylene carbonate is brought in contact with the substrate through a liquid shower and megasonic waves are then applied to this liquid.

[Recycling of Film Removal Treatment Reagent Liquid through Ozone Aeration]

As described above, by using an alkylene carbonate liquid, organic films such as resist films can be effectively stripped and removed, and components derived from the organic film end up dissolved (or dispersed) within the treatment liquid. If this organic material which has migrated into the liquid contains double bonds or aromatic compounds, as is the case with a novolak based resist, then by lowering the temperature of the liquid to 50° C. or lower and aerating the liquid with ozone gas, the organic material can be decomposed to low molecular weight material within a short time period, leaving a light colored, transparent liquid with no fine particles dispersed therein. Furthermore, it was found that the ethylene carbonate and propylene carbonate were largely chemically unaltered by the ozone gas aeration, with the exception of the generation of a small quantity of oxidizing materials, and that even if the treatment liquid contained the type of low molecular weight decomposed material described above, the resist stripping and removal performance of the liquid was not deleteriously affected.

Consequently, provided the treatment liquid is aerated with ozone gas following resist film removal treatment to decompose any resist components which have migrated into the liquid, the liquid can be circulated and reused, as is (if there are concerns about residual non-decomposed resist, then microfiltration may be performed if necessary), as the removal treatment liquid for the resist of another substrate. In other words, conducting ozone treatment offers the significant advantage of enabling the treatment liquid to be recycled. This ability to recycle the treatment liquid offers enormous economic benefits when compared with conventional, expensive organic solvent treatments. In the present invention, by using a recycling technique wherein the treatment liquid of a resist stripping treatment reagent is treated with ozone and microfiltered, the treatment liquid can be reused dozens of times without requiring replacement with fresh treatment liquid.

In addition, in the present invention, the step for taking the treatment liquid following removal of an organic film and aerating with ozone gas to decompose any components derived from the organic film down to low molecular weight materials may be performed using a batch method, and may also be conducted in a different area, such as a different building, from the area in which the organic film removal is performed. In such a case, where necessary a tank lorry may be used for transporting the treatment liquid long distances to the aforementioned different area.

The number of times the liquid can be circulated (in other words, the lifespan of the treatment liquid) will vary depending on the quantity of oxidizing materials generated at each ozone treatment and the purity of the treatment liquid, which will gradually decrease. The quantity of oxidizing materials generated by ozone treatment can be determined by iodometry, and the quantity will increase with increasing temperature. The oxidizing materials are liable to be generated in a more quantity when propylene carbonate is used than when ethylene carbonate is used, as described above. Accordingly, it is preferable that following completion of the decomposition of a resist, nitrogen or air is immediately passed through the treatment liquid to remove the residual ozone. This degassing process is also effective in preventing deterioration by ozone of the liquid transport pump or the filters used in the circulation of the liquid. Where necessary, oxidizing reactive materials contained in the liquid following ozone removal can be decomposed using a catalyst such as platinum or palladium.

When ozone gas is passed through and dissolved in a liquid, the distribution coefficient D is represented by the formula $D=C_L/C_G$, where $C_G$ [mg/L] represents the ozone concentration in the gas and $C_L$ [mg/L] represents the ozone concentration in a saturated liquid. According to the literature, the solubility of ozone in a solvent is greater for non-polar solvents such as acetic acid and dichloromethane, for which the value of D at room temperature is approximately 1.5 to 2. In contrast, the value of D at room temperature for polar solvents is approximately 0.4 at most, and is approximately 0.2 in the case of pure water. When ozone is dissolved in a colorless solvent, the solvent becomes a blue color, the deepness of which corresponds with the ozone concentration. Using this blue color of ozone water as a reference, determination of the D values at 40° C. for ethylene carbonate and propylene carbonate through comparison with the reference yields a value of approximately 0.25 in both cases. Furthermore, regardless of the type of solvent, the value of D decreases as the temperature increases. In other words, ozone becomes more difficult to dissolve. As a result of summarizing a large number of reports and past experiments, it became evident that the common logarithm of the D value is represented by an inverse linear expression of the absolute temperature of the liquid, and that the absolute temperature inverse coefficient was approximately the same value regardless of the type of solvent. Using this finding as the basis for an approximation, within the temperature range from room temperature to 100° C., every 10° C. increase in liquid temperature results in a decrease in the D value to approximately 8/10. Accordingly, as the D value of propylene carbonate at 20° C. is slightly less than 0.4, the D value at 50° C. will fall to 0.2. Consequently, aeration with ozone gas of concentration 250 mg/L will generate a dissolved ozone concentration in the propylene carbonate liquid of 50 mg/L. This concentration is adequate for decomposing novolak resist derived components dissolved or dispersed within the treatment liquid.

[Action of Dissolved Ozone Containing Treatment Liquid]

As described above, organic film components which migrate into the treatment liquid during the organic film removal treatment are decomposed by ozone treatment. Consequently, if an alkylene carbonate containing dissolved ozone is used in the organic film removal process, then the synergistic effect of the solvency action of the treatment liquid solvent together with the decomposition action of the ozone, results in a markedly improved stripping and removal performance even for treatment temperatures of 60° C. or lower.

In the immersion treatment of a novolak based resist which has not undergone ion implantation (and has therefore not degenerated), if a ozone saturated propylene carbonate is used, then in comparison with propylene carbonate containing no dissolved ozone, a 5 fold increase in stripping rate can be achieved at 20° C., and a greater than 2 fold increase can be achieved at 30 to 40° C.

For a film of thickness 1.5 $\mu$m with ion implantation of $B^+$ at $1\times10^{14}$ ions/cm$^2$, immersion in ozone saturated ethylene carbonate at 50° C. leads to complete decomposition in several minutes, and the resulting liquid is transparent, with no dispersed fine particles of removed resist. In a case in which a high concentration ion implanted resist film is stripped using only a high temperature alkylene carbonate liquid, the small quantity of fine particles of degenerated resist which remain adhered to the surface can be completely removed by subsequent rinsing with an ozone saturated alkylene carbonate liquid.

In the case of a cyclized isoprene-based resist, which is a typically representative negative type resist, the decomposition by ozone of polyisoprene, which represents a major component of the resist, is extremely fast, and because the photo-crosslinked azide compound typically employs an aromatic compound, this type of resist film can be stripped with an ozone saturated treatment liquid at an even faster rate than a novolak based resist.

In the case of an organic film removal in which the treatment liquid contacts the substrate surface in the form of a moving liquid film, if the treatment liquid is saturated with ozone in an ozone saturation vessel and then supplied to the substrate surface through a nozzle, then similar excellent removal effects to those described above can be achieved. In order to achieve the required ozone concentration, the temperature of the liquid should preferably be not more than 50° C. At high temperatures the ozone concentration decreases, and consequently the piping linking the ozone saturation vessel and the nozzle within the organic film removal apparatus should be kept as short as possible. If a megasonic spot shower is used as the nozzle, then the stripping rate can be improved even further. This method is particularly useful if a process requires a powerful stripping treatment at a temperature of 50° C. or lower, such as in the case of a dry etched resist.

A simple method which employs the action of ozone in a single wafer processor for removing an organic film from a substrate can be provided by a liquid film formation treatment in which a treatment liquid and ozone gas are projected simultaneously onto the substrate surface. In such a case, very little ozone dissolves in the treatment liquid, although projection of room temperature propylene carbonate enables the stripping of a cyclized isoprene based resist, and the stripping rate falls very little from immersion treatment with ozone aeration. Furthermore, this simple method also offers satisfactory stripping of novolak based resist films which have not undergone degeneration. For example, in a continuous treatment process for a large glass substrate for use in a liquid crystal application, wherein the glass substrate is moved within the plane of the substrate surface, in those cases in which resist stripping is performed by spraying on a treatment liquid, then by providing a slope for a liquid film to move across the substrate surface, a simple method in which the treatment liquid and ozone gas are projected simultaneously onto the substrate surface can be utilized.

As alkylene carbonate exhibits the D value temperature dependency described above, ozone dissolution at 80° C. is D=0.05. At this temperature, the ozone dissolved in the liquid decays very rapidly, although it provides an extremely powerful decomposition action. Accordingly, in order to effectively increase the stripping performance in a high temperature liquid film treatment, the concentration of the ozone gas contacting the liquid film surface should be maintained at a maximum. In the liquid film, the ozone concentration of the liquid will momentarily reach a balance with the ozone concentration of the gas, providing the liquid film with an ozone concentration sufficient to achieve the desired effect. In order to achieve this effect, an apparatus is required in which the thickness of the ozone gas space above the treatment surface is kept very thin so that the air initially contacting the liquid film can be substituted with ozone gas in as short a time as possible. According to such a technique, even a resist film of thickness 1.5 $\mu$m which has undergone ion implantation of $B^+$ at $1\times10^{14}$ ions/cm$^2$ can be removed within 30 seconds, including the subsequent rinse, by treatment at 80° C., enabling a single wafer spin processing to be effectively utilized with a good level of productivity.

Because both ethylene carbonate and propylene carbonate have a high boiling point, if they are used for rinsing, and a subsequent spin drying process is then performed, then a film of molecules of these compounds will remain adhered to the wafer surface. Consequently, a subsequent rinse with ultra pure water should preferably be performed. In the case of rinsing with pure water, once a wafer surface dries, if the surface is silicon then the air causes a natural oxide film to form immediately, and any residual fine particles are trapped by this film making removal by pure water rinsing difficult. In contrast in the case of an ethylene carbonate liquid rinse, if the substrate is cooled to room temperature with an ultra thin liquid film still on the surface, then the ethylene carbonate liquid film solidifies. This offers an advantage in that the substrate surface is separated and protected from the surrounding atmosphere by this solidified film. The substrate can then be transported to a separate pure water rinse system and rinsed with water.

[Use of Complexing Agents (Chelating Agents)]

As described above, an alkylene carbonate liquid is useful as a treatment liquid which can be circulated and reused for the stripping and removal of organic films from substrates, although metal impurities in the resist accumulate within the liquid as the number of repeated uses of the liquid increases. Because the liquid is neutral, there is a danger of these metal impurities adhering to, and contaminating the stripped substrate surface. However, if an aliphatic carboxylic acid based complexing agent (chelating agent) is added to the treatment liquid, then not only is there a decrease in the likelihood of metal impurities of Fe, Ni, Cr, Cu, Zn and Al adsorbing to a silicon surface or an oxidized surface or the like, but even contamination by Na and K can be reduced.

In those cases where, as described above, an aliphatic carboxylic acid based complexing agent (chelating agent) is added to the treatment liquid, typically between 0.01 and 2% by weight of the aliphatic carboxylic acid based complexing agent is incorporated relative to the amount of ethylene carbonate, propylene carbonate, or a mixture of ethylene carbonate and propylene carbonate. Examples of the aliphatic carboxylic acid based complexing agent include tartaric acid, citric acid and oxalic acid, although of these, tartaric acid and citric acid are preferred as they offer low toxicity and are capable of complexing a large variety of metals. The amount of these acids added is as described above, although quantities from 0.03 to 1.5% by weight are preferred. If the quantity of added acid is too large, then the ethylene carbonate and/or the propylene carbonate itself is more likely to undergo decomposition, whereas if the quantity is too small, the metal capturing performance is limited.

EXAMPLES

As follows, an organic film removal method and apparatus according to the present invention are described in detail using a series of examples. However, the present invention is in no way restricted to the examples presented below.

The ozone gas used in the following examples was produced by passing oxygen containing 0.4% of nitrogen through a discharge type ozone generation device at a rate of 2 to 10 L/minute, and what is described below as high concentration ozone gas refers to a gas with an ozone concentration of approximately 250 mg/L. The ethylene carbonate and propylene carbonate used was of guaranteed reagent grade purity.

Furthermore, in a production process for an advanced ultra LSI, minimal quantities of organic matter (an organic carbon concentration of not more than $2 \times 10^{13}$ atoms/cm$^2$) on the wafer surface are required, and in the following examples, the absolute quantity of residual organic carbon on top of a silicon oxide film following resist stripping was determined in accordance with the sample preparation method disclosed in Japanese Laid-open publication (kokai) No. 2000-39410 (JP2000-39410A), which is a highly sensitive charged particle radioactivation analysis method in which $^{13}N$ generated by nuclear reaction of $^{12}C(d, n)^{13}N$ is chemically separated, and the $\beta^+$ annihilation radiation emitted by this $^{13}N$ is then measured by a pair of detectors operated in coincidence.

Example 1

FIG. 1 shows a schematic illustration of an apparatus in which a cassette containing a plurality of wafers with resist films is immersed in an ozone gas aerated ethylene carbonate molten liquid to remove the resist films.

A draft built for the experiments is divided into a front chamber 1, a treatment chamber 2 into which cleaned air is introduced, and a rear chamber 3. Opening glass doors are provided on all surfaces, although during operation the inside of the draft is isolated from the external atmosphere. The valves described below are all electromagnetic valves, and operation of these valves, a liquid transport pump, and a robot (for transporting the cassette) are all performed from outside the draft.

In order to enable a quartz glass cassette 5 capable of holding 7 six inch wafers 4 to be moved from the front chamber 1 into the treatment chamber 2, which has an exhaust outlet in the rear (not shown in the diagram), and then pass through the rear chamber and be removed from the draft following treatment, the front chamber 1 and the rear chamber 3 are provided with an air exchange mechanism (not shown in the diagram) and opening doors 6 which prevent the ozone gas containing atmosphere inside the treatment chamber from leaking outside the draft.

Quartz glass vessels 7, 8 and 9 are positioned inside the treatment chamber 2. The vessel 7 is a vessel containing approximately 3 L of ethylene carbonate for treating the cassette, the vessel 8 is a vessel for performing a spray rinse with unused ethylene carbonate, and the vessel 9 is an overflow rinse vessel using ultra pure water.

Ethylene carbonate liquid is supplied to the vessel 7 via a supply pipe 10. An ozone gas diffuser 11 and a heater 12 for maintaining the immersion treatment liquid at a predetermined temperature are provided in the bottom portion of the vessel, and the former is connected to a gas inlet pipe 14 which supplies gas from an ozone gas generation device (not shown in the diagram) via a valve 13. The wafer containing cassette 5 is moved into the treatment chamber using a robot arm 15 (the robot itself is not shown in the diagram), and then lowered into the treatment liquid of the vessel 7 and immersed for a predetermined period of time. The cassette 5 is then transported to the vessel 8. An ethylene carbonate liquid spray nozzle 16 is attached to the tip of a horizontally rotating arm 17, and this spray nozzle is positioned over the vessel 8 only when the cassette has been set inside the vessel. The rotational axis 18 of this arm is operated by a rotation mechanism 19. The arm and the rotational axis also perform the function of a rinse liquid transport pipe, and are connected, inside the rotation mechanism 19, to a rinse liquid supply pipe 21, which is linked to a liquid storage tank with a pressurized supply function (not shown in the diagram) via a valve 20.

Following completion of the spray rinse using ethylene carbonate liquid, the cassette is transported by the robot to the vessel 9, and subjected to an overflow rinse in ultra pure water supplied through a supply pipe 23 via a valve 22. Numeral 24 represents a stainless steel outer vessel, and numeral 25 represents a waste water pipe.

The vessel 7 and the vessel 8 are each attached to a chemical supply vessel, 26 and 27 respectively, constructed of a fluororesin, which are provided in a liquid supply systems chamber 28 positioned underneath the treatment chamber. At the top of the vessel 27, a rinse waste liquid collection pipe 29 is connected to the narrowed bottom edge of the rinse vessel 8 via a valve 30. Furthermore, a treatment liquid supply pipe 31 for introducing ethylene carbonate liquid is provided at the base of the vessel 27, and this treatment liquid supply pipe 31 is connected to a liquid storage tank with a pressurized supply mechanism (not shown in the diagram) via a valve 32. The liquid in the vessel 27 is first transported to the vessel 26, and this transfer is achieved through a connection pipe 34 provided with a liquid transport pump P and a three way valve 33. The numerals 35 represent gas exhaust pipes.

A liquid waste pipe 36 provided at the base of the vessel 7 is connected to the roof section of the vessel 26 via a valve 37. Furthermore, a gas diffuser 38, which is connected to an inert gas supply pipe 40 via a valve 39 and enables aeration with an inert gas (nitrogen or ultra pure air), is provided inside the vessel 26, towards the bottom of the vessel. A discharge pipe 42 enabling discharge of liquid via a valve 41 is provided in the base of the vessel 26. Liquid inside the vessel 26, from which ozone has been removed through the degassing process with inert gas, is passed through a fine particle removal precision filter F (constructed of a fluororesin) using the action of a liquid transport pump P, and is then pumped through the supply pipe 10 to the vessel 7.

Because the melting point of ethylene carbonate is 36° C., the vessels 26 and 27 are provided with internal heaters 12 near the bottom of each vessel for maintaining the temperature of the treatment liquid at 40° C. or greater. Furthermore, the ethylene carbonate liquid storage tank is also provided with a heater, and solidification of ethylene carbonate within the treatment system is prevented by using a fluororesin or the like for most of the piping for the liquid, and also wrapping the piping in an insulating material. In other words, the sections drawn in solid bold lines in the diagram are equipped with insulation measures for maintaining the internal temperature at 40° C. or greater.

The apparatus described above was used to investigate the resist stripping action of ethylene carbonate liquid at a liquid temperature of 40° C. The samples used were oxidized six inch silicon wafers, which had been surface treated with HMDS, and a 1.5 µm novolak resin based i-line radiation positive resist (product name: IX555, manufactured by JSR Corporation) then applied and baked at 140° C. for 60 seconds. First, one of these wafers was set in the cassette, while a high concentration ozone gas was bubbled through the ethylene carbonate molten liquid in the vessel 7 for 5 minutes at a rate of 2 L/minute. Once it had been confirmed that the 42° C. liquid had turned a slight blue color as a result of the dissolved ozone, the cassette was immersed in the liquid, and by observing the progress of the stripping of the resist with the naked eye, it was confirmed that the resist had been entirely stripped away after 4 seconds (a stripping rate of 22.5 µm/minute). Subsequently, the cassette was immediately raised out of the liquid, subjected to a two second spray rinse with ethylene carbonate in the vessel 8, and then subjected to overflow rinsing with ultra pure water for 3 minutes in the vessel 9. After subsequent spin drying, the surface of the wafer was inspected with a microscope, and no non-stripped sections were visible. The liquid temperature in the vessel 7 immediately following the raising of the cassette was 40° C.

In contrast, when a cassette with a single sample was immersed in the vessel 7 in a similar manner but without the bubbling of ozone, observation with the naked eye suggested the stripping was completed in 5 seconds (a stripping rate of 18 µm/minute). At 40° C. the solvency action of the ethylene carbonate itself, is high, and even without passing ozone gas through the liquid, the resist can still be removed in a short period of time. Following stripping of the resist, the liquid was a pale yellow color.

Next, seven wafers were inserted into a cassette, filling all the available slots, and in a similar manner to that described above, ozone was bubbled through the liquid in the vessel 7, and the cassette was then immersed for 6 seconds, before being spray rinsed with ethylene carbonate for 4 seconds in the vessel 8. The spray nozzle 16 utilized a full cone ceramic spray nozzle, with a spray rate of approximately 500 mL/minute. Following a 5 minute ultra pure water rinse in the vessel 9 and subsequent spin drying, the resists from each of the wafers were confirmed by naked eye inspection as being totally removed. A 2 cm×2 cm chip was then cut out of each wafer, and the quantity of residual organic carbon (atoms/cm$^2$) was determined by charged particle radioactivation analysis. The average result was $1.8 \times 10^{13}$, with a maximum value of $2.1 \times 10^{13}$, indicating that the resist, including the HMDS layer, had been satisfactorily removed. Following removal of the cassette, the ethylene carbonate liquid was not a pale yellow color, but rather a pale blue color, indicating quite clearly that decomposition by ozone of components of the stripped resist is occurring within the liquid.

Example 2

As confirmed by the results of the example 1 above, the stripped resist components are decomposed by the ozone, and consequently the treatment liquid used in the resist stripping process should be able to be reused several times. Using the same apparatus described in FIG. 1, the action of the recycling mechanism for the treatment liquid is described below.

Using a cassette capable of holding 7 samples of identical specification to those described in the example 1, the stripping, rinsing and drying processes were performed in the same manner as the example 1.

In the vessel 7, following the raising of the cassette, ozone gas was bubbled through the liquid for a further one minute to decompose the dissolved resist, and the valve 37 was then opened, and all of the liquid in the vessel 7 was transferred to the vessel 26. Subsequently, the valve 39 was opened, and nitrogen gas was bubbled through the liquid. Within one minute, the ozone dissolved in the liquid had been removed, and the liquid was then pumped out of the vessel 26 by the liquid transport pump P, passed through the precision filter F, and the filtered ethylene carbonate liquid was then returned to the vessel 7. The valve 11 was then opened and ozone gas was bubbled through the liquid for 5 minutes, in the same manner as the example 1, and the next cassette treatment was then performed.

This resist stripping and decomposition/ozone degassing of liquid/filtering cycle was repeated 30 times. In other words, using ozone aerated ethylene carbonate liquid at 40° C., 210 wafers with resist films of identical specification were subjected to resist stripping, and the resist stripping action for the samples of the final cassette was still quite satisfactory. Accordingly, even after 30 repeated cycles of the stripping process, or in other words 5 hours of continuous apparatus operation with the same liquid, there was no deterioration in the resist stripping action of the ozone containing ethylene carbonate liquid, indicating that there was effectively no decomposition or deterioration of the ethylene carbonate itself. This finding suggests that in comparison with typical solvent treatments in which the stripping action of the solvent deteriorates as the quantity of dissolved resist increases, the present invention offers extraordinary advantages. In the type of continuous operation mentioned above, even if the time required for resist stripping is 3 minutes, repeated stripping treatment can still be performed with a similar tact time to conventional multiple tank immersion cleaning apparatus of approximately 10 to 15 minutes.

In these repeated operations, the rinse liquid in the vessel 8 passes through the open valve 30 and collects in the vessel 27. Following the completion of a predetermined number of treatments, the liquid in the vessel 7 is transferred to the vessel 26 and is then discharged into a waste liquid vessel (not shown in the diagram) via the valve 41. Subsequently, the valve 33 is opened, and the ethylene carbonate liquid in the vessel 27 is replenished, and this liquid is then passed through the vessel 26 and transferred to the vessel 7. From this point, the operation described above can be repeated.

Example 3

Propylene carbonate is a liquid at room temperature, with chemical properties similar to those of ethylene carbonate liquid, and consequently the same apparatus as that described in FIG. 1 was used to investigate the resist stripping and removal action of propylene carbonate.

A single wafer sample of the same specifications as that used in the example 1 was placed in a cassette, and using the same treatment conditions as those described for the single wafer treatment in the example 1, with the exception of replacing the ethylene carbonate with propylene carbonate, and following the same process as the ozone gas aerated sample described in the example 1, the temperature dependency of the stripping performance was investigated. The results are shown in Table 1. In Table 1, the determination of the stripping time required was judged by naked eye observation, and the figures for stripping rate were then calculated from these times.

The ozone concentration of a liquid is typically determined by iodometry, that is, by the amount of oxidation of potassium iodide (equivalent to the quantity of generated iodine). It is already known that the solubility of ozone in a liquid decreases as the temperature of the liquid increases, and consequently, as the temperature of an ozone containing liquid is increased, typically the quantity of iodine generated by iodometry should decrease. However, in the case of propylene carbonate, the propylene carbonate molecule itself reacts with the ozone, forming a separate oxidizing material, and it is thought that the quantity of this material increases with increasing temperature of the liquid. In other words, as a result, the quantity of iodine generated through iodometry actually increases with increasing temperature. Taking the quantity of iodine generated at 20° C. to be 1, the proportional quantities of iodine generated at each temperature are shown in the table.

TABLE 1

| Immersion temperature (° C.) | Stripping time required (seconds) | Stripping rate ($\mu$m/minute) | Quantity of Iodine generated by iodometry |
|---|---|---|---|
| 20 | 12 | 7.5 | 1 |
| 30 | 7 | 12.8 | 1.38 |
| 40 | 4 | 22.5 | 1.75 |

The stripping test results on wafers of the same specifications, but for the case in which ozone gas was not bubbled through the propylene carbonate vessel, are shown in Table 2.

TABLE 2

| Immersion temperature (° C.) | Stripping time required (seconds) | Stripping rate ($\mu$m/minute) |
|---|---|---|
| 20 | 55 | 1.6 |
| 30 | 15 | 6.0 |
| 40 | 8 | 11.3 |

As is shown in Table 2, even if ozone gas is not bubbled through the liquid, the stripping rate still increases markedly as the immersion temperature is raised. The reason for this observation is that as the temperature of the liquid is increased, the solvency action on the resist improves. If ozone gas is passed through propylene carbonate, the color of the liquid changes to a pale blue, and as the temperature of the liquid is raised the strength of this blue color diminishes, although even at 40° C. a very pale blue color is still visible. In comparing the results in Table 1 and Table 2 it is evident that at a liquid temperature of 20° C. where the ozone concentration is comparatively high, ozone aeration of the liquid produces an approximately 5 fold increase in the stripping rate over the case of no ozone aeration. In contrast, at 30° C. and at 40° C., the increase in stripping rate is only approximately two fold. However, even the liquid following the stripping treatment displays a very pale blue color with ozone aeration, indicating that even though the concentration of soluble ozone decreases with increasing liquid temperature, the dissolved ozone still displays an organic material decomposition effect. Moreover, there is a possibility that the oxidizing materials generated from the propylene carbonate are contributing to the observed increase in stripping rate, although this effect is unlikely to be highly significant.

Two wafers of the same specification were treated using an immersion temperature of 40° C., with an immersion time of 6 seconds in the case of ozone aeration and an immersion time of 10 seconds in the case of no ozone gas aeration, and were both then subjected to a 4 second spray rinse with propylene carbonate and a 5 minute rinse with pure water. A 2 cm×2 cm chip was then cut out of each wafer, and the quantity of residual organic carbon was determined by charged particle radioactivation analysis. The result was $1.7 \times 10^{13}$ atoms/cm$^2$ for the ozone aerated sample and $2.0 \times 10^{14}$ atoms/cm$^2$ for the non-aerated sample, indicating that provided ozone is added, propylene carbonate produces a satisfactory resist stripping action with a similar fast stripping rate to that of ethylene carbonate liquid.

Example 4

From the results of the examples 1 through 3 described above, it is apparent that a marked improvement in stripping rate can be expected on heating, for both ethylene carbonate liquid and propylene carbonate. Furthermore, both compounds have a high boiling point and a high flash point, and treatment at temperatures of up to 150° C. pose no danger. Consequently, using the apparatus of FIG. 1, the stripping action at not less than 40° C. was investigated for a resist film which had been subjected to high concentration ion implantation, which represents a resist film which conventionally cannot be satisfactorily removed unless ashing is used.

The samples used were oxidized six inch silicon wafers to which a 1.5 $\mu$m novolak resin based positive resist (product name: IX500, manufactured by JSR Corporation) had been applied (without preliminary treatment with HDMS) before baking at 130° C. for 4 minutes, and which had then been subjected to 30 keV ion implantation of $^{11}$B$^+$ across the entire wafer surface at either $1 \times 10^{14}$ ions/cm$^2$ or $1 \times 10^{15}$ ions/cm$^2$.

Without performing ozone aeration of the vessel 7 of FIG. 1, the liquid temperature inside the vessel 7 was raised to 40° C., and a single $1 \times 10^{14}$ ions/cm$^2$ implantation sample was placed in a cassette and immersed, and the resist stripping performance was observed with the naked eye. With either ethylene carbonate or propylene carbonate, after 5 minutes immersion the resist surface had become jagged and a portion of the resist had been dissolved, but when separate $1 \times 10^{14}$ ions/cm$^2$ implantation samples were treated with the immersion temperature raised to 60° C., the resist film was able to be completely stripped, in 1 minute and 40 seconds in the case of ethylene carbonate liquid, and in 2 minutes 20 seconds in the case of propylene carbonate. The stripping rates were 0.9 $\mu$m/minute and 0.6 $\mu$m/minute respectively, which if applied to a batch immersion treatment process, represent sufficiently fast stripping rates as to be viable. When the samples were rinsed and dried in the same manner as the examples described above, and the quantity of surface residual organic carbon was determined by charged particle radioactivation analysis, the results were $3.1 \times 10^{13}$ atoms/cm$^2$ and $3.4 \times 10^{13}$ atoms/cm$^2$ respectively, representing a level of resist stripping which is almost satisfactory.

Using these B$^+$ $1 \times 10^{14}$ ions/cm$^2$ implantation samples, the temperature dependency of the stripping rate for samples immersed in heated ethylene carbonate liquid or propylene carbonate was investigated. The results are shown in Table 3.

TABLE 3

| Liquid temperature (° C.) | Ethylene carbonate liquid | | Propylene carbonate | |
|---|---|---|---|---|
| | Stripping time required (seconds) | Stripping rate(μm/minute) | Stripping time required (seconds) | Stripping rate (μm/minute) |
| 60 | 100 | 0.9 | 140 | 0.6 |
| 80 | 40 | 2.3 | 60 | 1.5 |
| 100 | 10 | 9 | 14 | 6.4 |
| 120 | 5 | 18 | 6 | 15 |

For both compounds, the stripping rate increases markedly with increasing immersion temperature. Even at 120° C., the vapor pressure is not particularly high, and any vapor can be exhausted with ease. Furthermore, because the toxicity of the vapor is low, even this type of high temperature treatment has little effect on people.

Ethylene carbonate displays a slightly superior stripping performance to propylene carbonate. Considering the stripping performance at temperatures of 100° C. or greater, single substrate treatment is possible simply by heating the treatment liquid.

If the amount of ion implantation is $1\times10^{15}$ ions/cm$^2$ or greater, then the degenerated sections of the resist undergo considerable hardening, and as a result, complete dissolution is difficult even with ethylene carbonate liquid, and for samples in which the entire resist film on a wafer surface has been subjected to ion implantation, stripping of the resist leads to fine particles of undissolved resist becoming dispersed within the liquid. Actual resists subject to resist stripping treatment typically comprise a fine pattern, and consequently using the ion implantation wafers prepared in the manner described above as samples for a stripping test would represent a test which is overly different from actual treatment conditions. Consequently, a 1 mm square grid pattern of light scratches was formed in the surface of the above ion implantation resist films using a diamond dicer, and these scratched resist films were then subjected to stripping treatment. The results are shown in Table 4.

TABLE 4

| Liquid temperature (° C.) | Stripping time required (seconds) | |
|---|---|---|
| | Ethylene carbonate | Propylene carbonate |
| 80 | 210 | 200 |
| 100 | 100 | 110 |
| 120 | 70 | 70 |

High concentration ion implantation is typically performed on resists formed on an oxide film or a nitride film, and because these treatment liquids are neutral organic compounds, it is though that deleterious effects on such oxide films or the like are extremely unlikely, even for immersion for approximately 3 minutes at a temperature of 100° C. or greater. Accordingly, even high concentration ion implantation samples of $1\times10^{15}$ ions/cm$^2$ or greater should be able to be satisfactorily removed by immersion treatment at temperatures exceeding 100° C. by as much as is practical (for example, 200° C.).

Example 5

Figure 2:
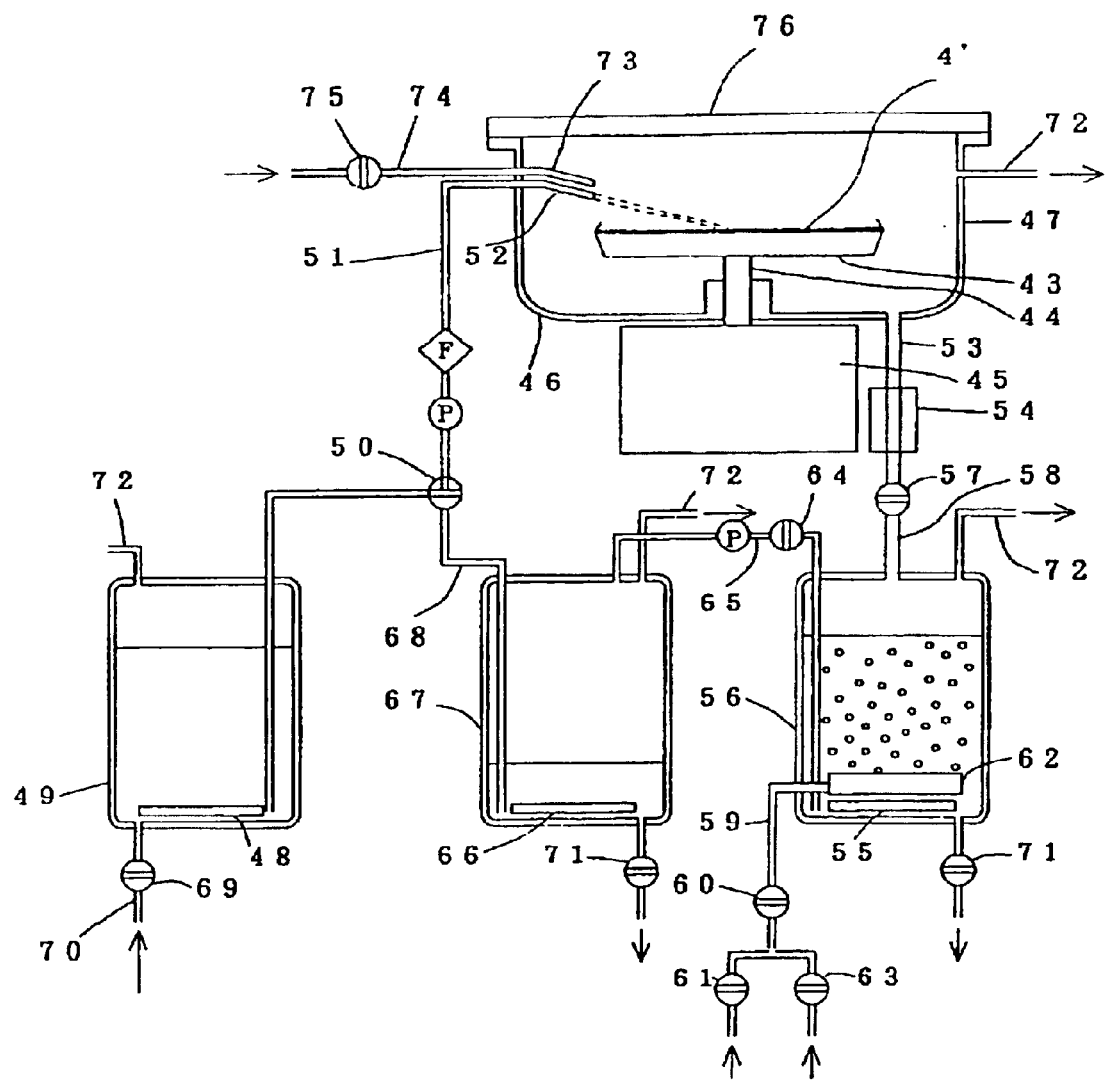
FIG. 2 is a schematic longitudinal sectional view of an apparatus employing the present invention in a single wafer spin method.

FIG. 2 shows an apparatus for performing stripping via single wafer spin processing using ethylene carbonate liquid. The mechanism for performing the single substrate spin treatment comprises a support 43 for supporting a six inch wafer 4', a rotational axis 44, and a drive section 45, enabling the wafer 4' on top of the support 43 to be spun around at a variable speed from a slow speed to a high speed, and this mechanism is housed inside a chamber 47 with a bottom 46. Ethylene carbonate liquid is heated inside a vessel 49 equipped with a heater 48 capable of heating the liquid to a predetermined temperature such as 100° C., and is stored in a liquid state. By operating a three way valve 50, a liquid transport pump P pumps the liquid through a fine particle removal filter F and a pipe 51, and the liquid is then supplied onto the surface of the wafer 4' through a nozzle 52 provided at the tip of the pipe 52, at a flow rate of 1 to 2 mL/minute.

The ethylene carbonate liquid, which has been heated to a high temperature, dissolves the resist in an extremely short period of time, and the centrifugal movement of the liquid film effectively removes the dissolved material. Depending on the difficulty of the actual stripping and the temperature at which the treatment is performed, the stripping treatment time may vary from several dozen seconds down to several seconds. The rotational speed should preferably be from 100 to 200 rpm. In those cases in which a rinse is then performed, the rinse may be performed in several seconds at a rotational speed of approximately 1000 rpm. The treatment liquid which has dissolved the resist and then fallen into the bottom of the chamber is first transferred to a waste liquid cooler 54 via a pipe 53. Following cooling to approximately 40° C., the liquid passes through a valve 57 and drops down a pipe 58 into a vessel 56 provided with a heater 55 for maintaining the temperature at 40° C. Once the liquid inside the vessel 56 has reached a predetermined quantity, ozone gas supplied from an ozone gas generation device (not shown in the diagram) is passed through valves 61, 60 and a diffuser pipe 59, and is bubbled through the liquid using a diffuser 62. This ozone gas aeration causes the resist components either dissolved or dispersed within the ethylene carbonate liquid to rapidly decompose via the generation of ozonides, and the liquid in the vessel, which was a yellow color following resist stripping, rapidly changes to a colorless or pale blue transparent liquid.

During this process, the ethylene carbonate liquid is chemically quite stable with respect to the ozone, although small quantities of oxidizing reaction products (thought to be peroxides) are generated. These products have almost no effect on the resist stripping performance, although the quantity of these materials gradually increases with increasing ozone treatment time, and because the generation of these oxidizing materials results in a gradual degeneration of the liquid, such reactions must be suppressed as far as possible. Accordingly, once ozone aeration has dissolved the resist and the liquid has become either colorless or a pale blue color, the valve 61 is closed and the ozone gas aeration is halted. Next, using a valve 63 connected to a nitrogen gas supply line, nitrogen gas is bubbled through the liquid in the vessel 56, and any dissolved ozone is removed. This completes the recycling of the ethylene carbonate liquid. The recycled liquid is then transferred through a connecting pipe 65 to a vessel 67 equipped with a heater 66, using the action of a valve 64 and a liquid transport pump P. Once the liquid inside the vessel 67 has reached a predetermined quantity, the liquid is heated to a predetermined temperature, and is then supplied to the spray nozzle 52 through a recycled liquid supply pipe 68, using the three way valve 50 and the liquid transport pump P. The recycled liquid replaces the supply of new liquid from the vessel 49, and from this point, the liquid in this vessel 49 is used only for spray rinsing. A valve 69 is connected to a pipe 70 leading to a liquid storage tank (not shown in the drawing), and is used for supplying new liquid when required. Numeral 71 is a waste liquid valve, and numeral 72 represents an exhaust gas outlet.

A second nozzle 73 inside the chamber is connected to a cold air supply pipe 74 for supplying cooled air from a cooler (not shown in the diagram) via a valve 75. Following completion of a high temperature ethylene carbonate liquid rinse, the wafer is rotated at 2000 to 3000 rpm for approximately 5 seconds to remove any liquid from the wafer surface, and cold air is then blown onto the wafer from the nozzle 73, solidifying the thin film of residual ethylene carbonate on the wafer surface.

Transfer of a wafer to, and subsequent removal from the apparatus is performed by a robot (not shown in the diagram), which removes a wafer from the cassette, opens the lid 76 of the chamber 47, and then sets the wafer on the support 43. The lid 76 is then closed and the stripping treatment described above is carried out, and on completion of the treatment, the robot sets the wafer, with a solid ethylene carbonate film formed on the wafer surface, into a water rinsing cassette. When the water rinsing cassette has been filled, the wafers are rinsed with ultra pure water and then dried in a typical rinsing and drying apparatus, thereby completing the stripping process.

Regardless of whether the sample is a novolak resin based positive resist, a chemically amplified polyvinylphenol derivative based positive resist, or a cyclized polyisoprene based negative resist, by performing treatment at a liquid temperature of 80° C. or greater, even samples that have been subjected to considerably intense post baking, such as those treated at 140° C. for approximately 3 minutes, can be stripped within 10 seconds for a resist film of thickness 1 $\mu$m. The stripping rate is at least 6 $\mu$m/minute. In this type of stripping process, the treatment time including the rinse time is extremely short, and moreover because the ethylene carbonate liquid itself is neutral, metal films of Al, Mo, W, Ti or ITO and the like used for wiring are left effectively undamaged.

An oxide film which had been subjected to dry etching with a CF based reactive gas and consequently comprised a degenerated resist on the surface, which represents a resist which is typically removed by ashing with an oxygen plasma, was used as a treatment sample. The sample employed a TEG wafer with a pattern similar to an actual device pattern formed thereon, and the resist was a novolak resin system TFR-910PM (product name, manufactured by Tokyo Ohka Kogyo Co., Ltd.) with a film thickness of 1.2 $\mu$m. Treatment was performed for 15 seconds using ethylene carbonate liquid at 100° C. and a rotational speed of 200 rpm, rinsing was then performed for 5 seconds using the same treatment liquid at 1000 rpm, and then the liquid was removed through centrifugal action by spinning at 2500 rpm for 5 seconds. Following solidification of the residual ethylene carbonate on the wafer surface by cold air, the sample was subjected to an ultra pure water rinse and then drying in another wafer rinser/drier for a single substrate. Observation of the sample surface using an electron microscope reveled that the resist had been completely removed. In addition, the resist stripping rate was 5 $\mu$m/minute.

Example 6

Using single wafer spin stripping, an example is presented in which an effective treatment is achieved by spraying room temperature propylene carbonate liquid and ozone gas simultaneously onto a resist surface.

The apparatus shown in FIG. 2 was used, although modifications were made so that propylene carbonate was initially supplied to the vessel 49, the heaters provided in each of the vessels were not used, and the cold air supply pipe 74 was converted to an ozone gas supply pipe, enabling high concentration ozone gas to be supplied at a flow rate of 5 to 10 L/minute simultaneously with the propylene carbonate liquid supply. In addition, a separate nozzle and piping system were provided to enable a stream of high pressure nitrogen gas to be directed at the center of the wafer during the drying stage. With the exception of these modifications, treatment was performed in the same manner as the example 5.

The wafer used for the stripping test was of the same specifications as that used in the example 1. Under conditions including a temperature of 25° C. and 200 rpm, observation with the naked eye revealed that stripping required 10 seconds. The stripping rate was 9 $\mu$m/minute. Treatment was continued for a further 5 seconds, a rinse treatment was then performed at 1000 rpm for 5 seconds, and then high pressure nitrogen gas was blown onto the center of the wafer and spin drying was performed at 2500 rpm. Following this drying treatment, the wafer was then subjected to a further rinse in ultra pure water and spin drying using a separate rinser/drier, in a similar manner to the previous example. Charged particle radioactivation analysis of the residual carbon on the wafer surface revealed a result of $1.9 \times 10^{13}$ atoms/cm$^2$, indicating satisfactory stripping of the resist.

Example 7

As described above, increasing the treatment liquid temperature causes a decrease in ozone solubility, and so in the system described in the example 6 above, the ozone concentration in the propylene carbonate liquid film on the wafer surface will not reach a satisfactory value, and so no large improvement in stripping performance can be expected with increased temperature.

Figure 3:
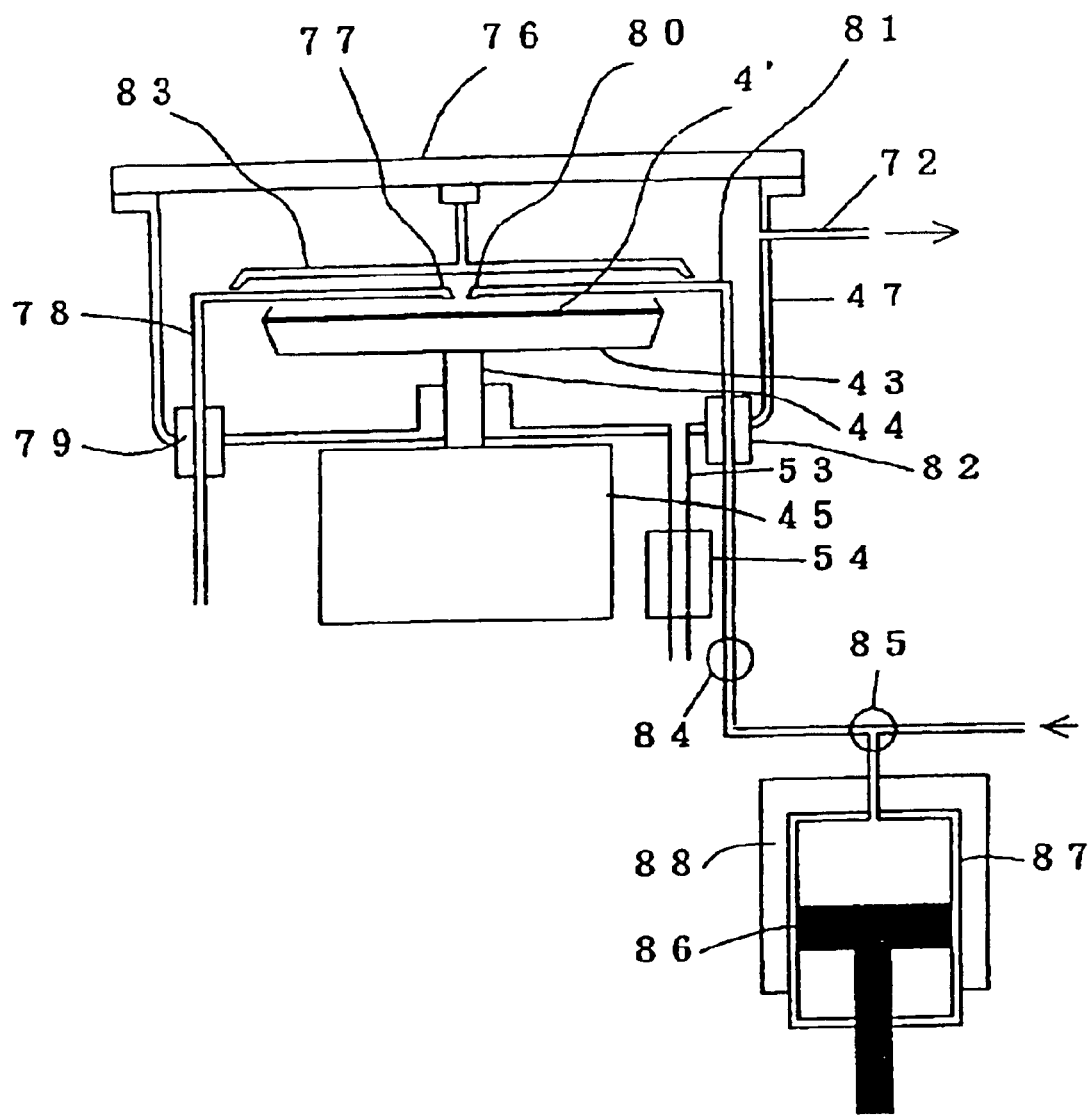
FIG. 3 is a schematic longitudinal sectional view of an improved chamber and ozone gas supply system for the apparatus of FIG. 2.

Consequently, the apparatus was modified as shown in FIG. 3, which represents an example in which ozone gas is supplied onto a wafer surface within a restricted, comparatively thin, layer-like space. Those sections not shown in FIG. 3 are identical with those of FIG. 2. The operation of those sections is as described in the example 5.

In FIG. 3, the chamber 47 is provided with a bearing 79 for a rotatable propylene carbonate liquid supply pipe 78 capable of discharging a liquid from a propylene carbonate discharge outlet 77 at the tip of the supply pipe 78 onto the center of the wafer 4', at the same flow rate described in the example 5, as well as a bearing 82 for a rotatable gas supply pipe 81 for emitting a stream of high concentration ozone gas from an emission outlet 80 at the tip of the gas supply pipe 81 onto the center of the wafer 4', wherein both the propylene carbonate liquid supply pipe 78 and the gas supply pipe 81 are positioned over the wafer 4' only during the period the wafer 4' is mounted on the support 43.

In addition, a roof-like quartz glass hood 83 is also provided which covers the entire wafer surface during the period in which ozone gas is projected onto the wafer surface, so that with the exception of the sections occupied by the liquid supply pipe and the ozone gas supply pipe, the layer above the wafer surface is approximately 5 mm. During insertion and removal of wafers, the hood is raised upwards together with the lid section, and set aside until needed. The propylene carbonate supply pipe 78 is connected to the fine particle removal filter F shown in FIG. 2, whereas the gas supply pipe 81 is connected to a high concentration ozone gas generation device (not shown in the diagram) capable of a gas flow rate of 4 L/minute. In a location close to a valve 84, the pipe from the ozone gas generation device is connected, via a three way valve 85, to a cylinder 87 which stores the ozone gas from the generation device temporarily and can discharge approximately 2 L of ozone gas from the emission outlet 80 within an approximately 10 second period, using the action of an automatic piston 86. This cylinder is surrounded with a heater 88 to enable the ozone gas inside the cylinder to be heated. In addition, the nozzle and piping system provided in the chamber 47 of the example 6 to enable a stream of high pressure nitrogen gas to be directed at the center of the wafer during the drying stage were also provided in this modified example.

Stripping and removal of a resist is conducted in the manner described below. A $1\times10^{14}$ ions/cm$^2$ B$^+$ ion implantation wafer from the example 4 was used as a test sample. First, high concentration ozone gas which has been heated to approximately 80° C. (the heater is not shown in the diagram) is fed through the fluororesin three way valve 85 and into the cylinder 87 with the piston 86, for a period of approximately 30 seconds, filling the approximately 2 L storage capacity of the cylinder 87. Numeral 88 represents the heater for maintaining the temperature of the gas. The lid 76 and the attached hood 83 are then raised, and a wafer 4' is mounted on the support 43. The liquid discharge outlet 77 and the gas emission outlet 80 are then rotated into position over the center of the wafer, and the lid is closed, lowering the hood 83 and covering the entire surface of the wafer. The wafer is then slowly rotated at approximately 60 rpm, and propylene carbonate liquid which has been heated to 80° C. in the liquid vessel 49 is discharged onto the wafer for approximately 5 seconds using the liquid transport pump P, immediately forming a heated propylene carbonate liquid film across the entire wafer surface. If the rotation is briefly halted at this point, the three way valve 85 and the valve 84 are immediately operated, and approximately 1 L of the 80° C. high concentration ozone gas stored in the cylinder 87 is blown onto the surface of the wafer within a 5 second period, then almost all of the resist is stripped away. On completion of this ozone gas emission, the wafer is set at an intermediate rotational speed of 500 rpm, and propylene carbonate from the vessel 49 is discharged for approximately 5 seconds to perform a primary rinse. Following rinsing, the rotation and liquid discharge are once again halted, and the remaining 1 L of high concentration ozone gas in the cylinder is blown onto the surface of the wafer within a 5 second period, completing the stripping process. A secondary spin rinse is then performed in the same manner as the primary rinse. Following completion of this rinse, the hood is raised, and with the lid 76 in an open state, a stream of high pressure nitrogen gas is directed at the center of the wafer, while spin drying is performed at approximately 2500 rpm. When the surface of the wafer has dried, the wafer is removed from the chamber and subjected to a final pure water rinse and dry using a separate rinser/drier, in a similar manner to the previous example. The results with the test sample showed that much quicker stripping was possible with this type of wafer spin treatment than had been possible with immersion treatment at 80° C. The quantity of residual organic carbon on the wafer surface was $1.5\times10^{13}$ atoms/cm$^2$.

Example 8

Figure 4:
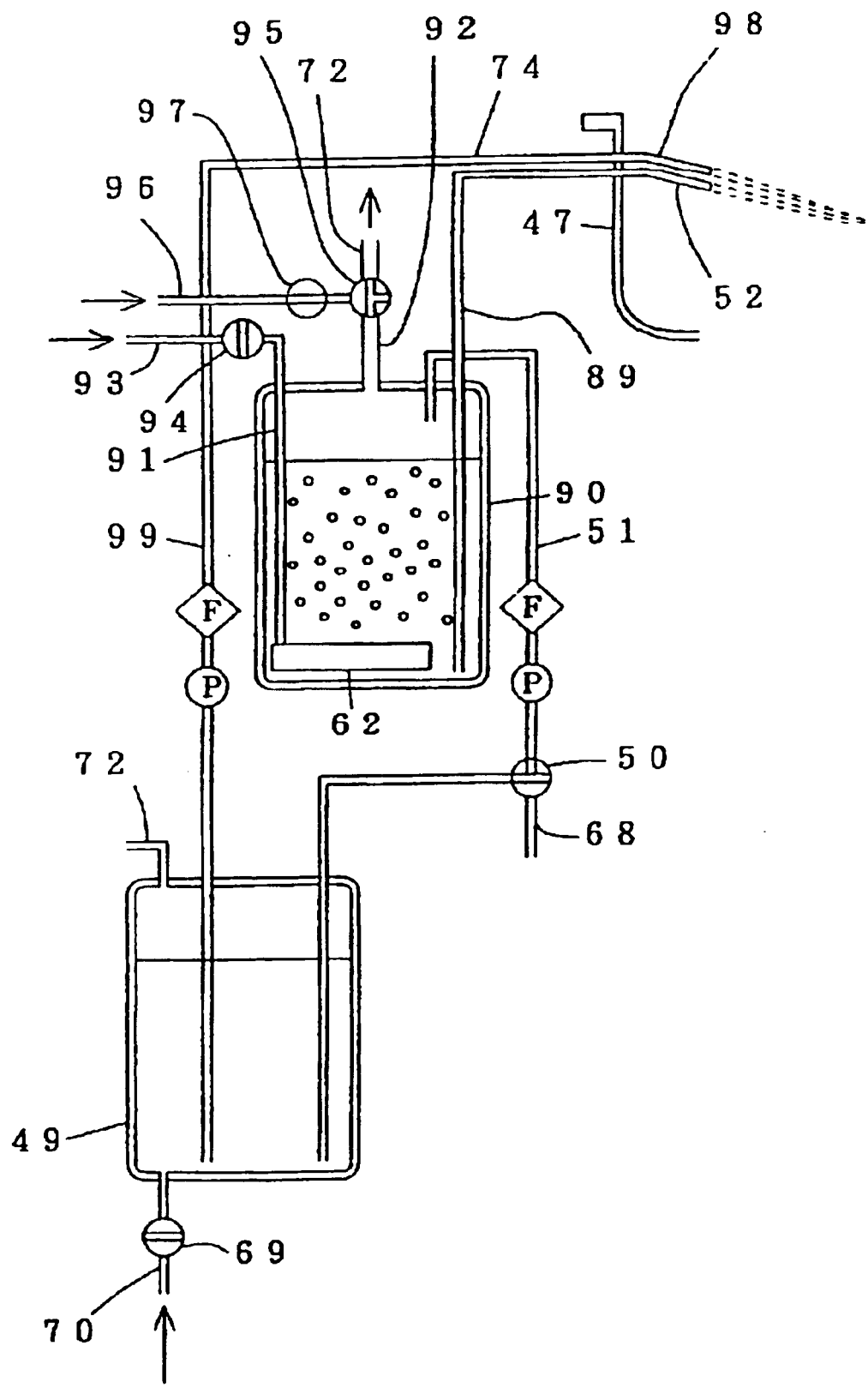
FIG. 4 is a schematic longitudinal sectional view of an improved treatment liquid supply system for the apparatus of FIG. 2.

In the dry etching of aluminum films, Cl or Br based gases are used. In such cases, residual amounts of these corrosive gases remain within the decomposed films of the resist surface and the side walls of the processed sections, and even ashing is unable to remove these residual gases. As a result, a subsequent wet treatment is required. If the present invention is applied to this type of treatment sample, then in order to avoid the danger of aluminum corrosion by residual halogens, treatment should preferably be conducted at as low a temperature as possible. Consequently, an example is presented for the stripping of a resist with room temperature propylene carbonate containing added ozone. As shown in the example 3 above, the stripping rate for a novolak resist which has undergone only post baking is an extremely fast 10 μm/minute at room temperature. Consequently, it was surmised that the stripping of a dry etched sample should also be possible within a short time frame, and stripping was attempted using a single substrate spin treatment method, using the modified apparatus of the example 6 which was further modified to enable the use of an ozone containing treatment liquid. FIG. 4 shows these additional modifications. Those sections not shown in FIG. 4 are identical with those of FIG. 2, and the operation of those sections is as described in the example 5.

The treatment liquid nozzle 52 is connected directly to a quartz glass ozone saturation vessel 90 with an internal capacity of approximately 1.5 L, via an inlet pipe 89. This vessel is attached to the unmodified treatment liquid supply pipe 51, a gas inlet pipe 91 for supplying gas to an internal ozone gas diffuser 62, and an internal pressure adjustment pipe 92 which performs the functions of an exhaust pipe and a pressurizing gas inlet pipe. Ozone gas is supplied through a pipe 93 from a generation device, via a valve 94. Gas which is bubbled through the liquid is exhausted through a three way valve 95. The stripping treatment is performed by operating a reduced pressure valve 97 and the three way valve 95 and supplying high pressure nitrogen gas to the vessel through a pipe 96, thereby forcing ozone saturated propylene carbonate through the nozzle 52 for a predetermined period of time.

Instead of the ozone gas nozzle used in the aforementioned example 6, a rinse nozzle 98 for spraying fresh propylene carbonate liquid is provided in parallel with the nozzle 52. The rinse liquid is supplied to the nozzle 98 through a rinse liquid supply pipe 99 connected to the vessel 49, having passed through a fine particle filter F under the action of a liquid transport pump P.

In this example, a novolak resin based positive resist on an aluminum film which had been subjected to dry etching with a Cl based reactive gas, which represents a resist which would typically be removed by ashing, was used as a test system, and a TEG wafer with a pattern similar to an actual device pattern formed thereon was prepared as a test sample. The thickness of the resist film was 1.2 μm.

1 L of room temperature propylene carbonate was placed in the vessel 90, and the liquid was aerated with high concentration ozone gas at flow rate of 2 L/minute for a period of 5 minutes. The three way valve 95 was then operated, and under the gas pressure of nitrogen gas, ozone saturated propylene carbonate was sprayed onto the wafer for 30 seconds at a flow rate of 120 mL/minute. Propylene carbonate from the vessel 49 was then supplied to the nozzle 98 by the liquid transport pump P, and a 5 second rinse was performed at the same flow rate. Subsequent treatment was performed in the same manner as the example 6, and following rinsing in ultra pure water and drying, the wafer surface was inspected under an electron microscope. No residual resist was visible, even on the side walls of the processed sections.

Example 9

This example presents applications of the present invention to paint film stripping from a steel plate component painted with an acrylic based synthetic resin paint, and to oil film removal from a machined component covered in an oil film of a cutting oil.

(9-1) Ethylene carbonate liquid at 80° C. was placed in a stainless steel vessel provided with a megasonic diaphragm in the base and a heater on the side walls, and a steel plate component painted with an acrylic based synthetic resin paint was immersed in the liquid and subjected to ultrasonic agitation at 1 MHz. The majority of the paint film had been stripped within 10 minutes, and a simple water shower was sufficient for final cleaning. The ethylene carbonate liquid following treatment was colored due to the paint pigment, but bubbling high concentration ozone gas through the liquid for 5 minutes at a rate of 2 L/minute produced a marked discoloration of the liquid.

(9-2) Ethylene carbonate liquid was placed in a stainless steel vessel equipped with a heater, and following heating to 100° C., a machined component covered in an oil film of cutting oil was immersed in the liquid for 2 minutes. The cutting oil dissolved in the liquid, enabling the oil film to be removed. The treatment liquid was colored slightly yellow, but bubbling ozone gas through the liquid in the same manner as described above resulted in total elimination of the coloring in approximately 5 minutes.

Example 10

The example 4 showed that a $1 \times 10^{14}$ ions/cm$^2$ ion implantation hardened resist could be stripped using heated ethylene carbonate, although on completion of the stripping process, fine particles of the hardened resist remain dispersed within the liquid. If repeated stripping treatments are conducted with the same liquid, then the quantity of these dispersed particles gradually increases, and so adhesion to the stripped surface becomes more likely, and removal by rinsing becomes more difficult. Consequently, if the temperature of the ethylene carbonate liquid is lowered to approximately 40° C. and high concentration ozone gas is bubbled through the liquid, then within 1 to 2 minutes these fine particles decompose and are dissolved in the liquid, forming a uniform liquid phase. As a result, the treatment liquid can be circulated and reused without placing a heavy load on the fine particle filter.

Figure 5:
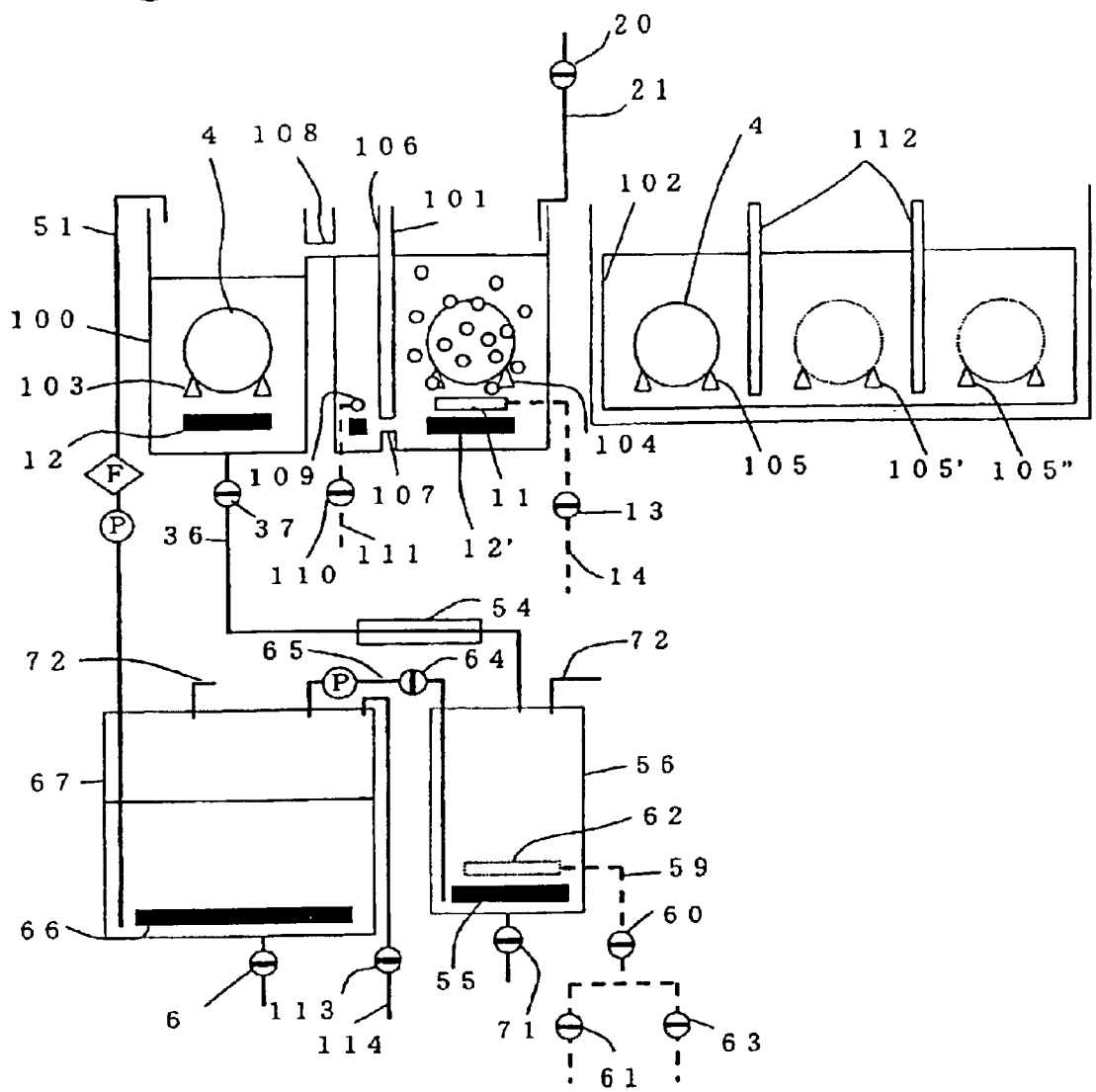
FIG. 5 is a schematic diagram of a batch treatment apparatus employing the present invention in the immersion of wafers requiring treatment.

FIG. 5 is a schematic diagram showing a batch treatment system designed to apply these modifications. In this system, a draft and a robot for moving the wafers 4 similar to those described in FIG. 1 are required, although because these components are completely standard items, their description here is omitted. However, in the system shown a cassette is not used for movement of the wafers, but rather a wafer chuck (not shown in the diagram) is used, which transfers each set of wafers sequentially to wafer cradles 103, 104, 105 provided within a stripping vessel 100, a treatment liquid rinse vessel 101 and an ultra pure water rinse vessel 102 respectively. In this system, 8 six inch wafers are aligned vertically with a spacing of 6 mm between wafers, and these wafers are treated in approximately 3 L of liquid. A heater 12 capable of heating the ethylene carbonate liquid to a temperature of 150° C. is provided within the stripping vessel 100, and a similar heater 12' is also provided in the treatment liquid rinse vessel 101, for maintaining the approximately 3 L of ethylene carbonate liquid contained therein at a temperature of approximately 40° C. Fresh ethylene carbonate liquid is heated and maintained at approximately 40° C. within a liquid storage vessel (not shown in the diagram), and is supplied to the vessel 101 through a rinse treatment liquid supply pipe 21 (hereafter, piping for liquids is shown using solid bold lines) via a valve 20, and is also transferred to a small capacity ozone removal vessel 106 through a connection pipe 107. Once these vessels are full, the liquid overflows through a connection pipe 108, filling the stripping vessel, and when approximately 3 L of liquid has flowed into the vessel, the valve 20 is closed, and the treatment liquid preparation phase is complete. At the base of the vessel 106 are provided a heater 12 for maintaining the temperature, and a diffuser 109 which is used for bubbling high purity nitrogen gas through the liquid to remove dissolved ozone, and which is connected to a nitrogen inlet pipe 111 (hereafter, piping for gases is shown using dashed bold lines) via a valve 110. An ozone gas diffuser 11 provided above the heater 12' within the vessel 101 is connected to an ozone gas inlet pipe 14 via a valve 13. Although no piping is shown in the diagram, the ultra pure water rinse vessel 102 is of an overflow type construction, and contains a wafer cradle 105 provided with sufficient wafer slots to accommodate three treatment batches, namely 24 wafers, so as to best conform with a conventional batch treatment system, wherein the drying process following pure water rinsing is typically conducted in batches of 24 or 25 wafers. The vessel 102 is an elongated shape, containing additional wafer cradles 105', 105" arranged in parallel, and during the rinsing process the wafers are transferred to the next cradle every 6 minutes, without being removed from the water, and are then finally supplied to a batch spin drier. Dams 112, which are raised only during movement of the wafers, are also provided between the cradles in the vessel 102.

Using the system described above, $1 \times 10^{14}$ ions/cm$^2$ B$^+$ ion implantation hardened resist wafers from the example 4 were used as test samples. The liquid in the vessel 100 was set to a temperature of 80° C., the liquid in the vessel 101 was set to 40° C., and high concentration ozone gas was then bubbled through the liquid in the vessel 101 at a flow rate of 2 L/minute. At the same time, nitrogen aeration of the vessel 106 was also commenced. Following 5 minutes of ozone gas aeration, 8 wafers were immersed in the vessel 100 for 1 minute, subsequently raised out of the liquid, and once dripping of the liquid had stopped, the wafers were set inside the vessel 101 and rinsed in ozone containing ethylene carbonate liquid for 1 minute (during this period, any dissolved resist or fine particles of hardened resist carried across with the wafers were decomposed), before being raised out of the vessel 101 in a similar manner to the removal from the vessel 100, and transferred to the overflowing pure water in the vessel 102. Using 8 wafers for each stripping lot, this stripping and rinsing treatment was repeated, and once the cradle 105 was filled with 24 wafers, the rinsing and drying process was conducted in the manner described above.

Naked eye inspection of each of these 24 wafers reveled that the resists had been completely removed. In addition, a sample of the wafers were also inspected under a microscope, and confirmed that the resist had been effectively stripped, with no fine particles of hardened resist visible. A further two wafer samples were subjected to charged particle radioactivation analysis to determine the quantity of residual organic carbon on the surface, and yielded results of $(1.8$ and $2.9) \times 10^{13}$ atoms/cm$^2$, indicating that this ion implantation hardened resist had been satisfactorily stripped within a very short time of only one minute.

Accordingly, hardened resists produced following dry etching can also be stripped within a short time period.

Example 11

Using the apparatus and treatment method described in the example 10, $1\times10^{15}$ ions/cm$^2$ B$^+$ ion implantation hardened resist wafers from the example 4 were used, as is (that is, without prior treatment with a diamond dicer) in a stripping test. However, the temperature of the ethylene carbonate liquid in the vessel 100 was raised to 150° C., and the immersion time was increased to 2 minutes. The test was conducted with only two wafers, and following drying, these wafers were subjected to the same observations as described in the previous example. The stripping was satisfactory, and no fine particles of hardened resist were visible. Determination of the quantity of residual organic carbon using charged particle radioactivation analysis yielded results of (2.5 and 3.6)$\times10^{13}$ atoms/cm$^2$, which while being slightly higher than the previous results, still represent a satisfactory level of cleanliness.

Example 12

An example based on the stripping apparatus of the example 10, but also provided with a mechanism for an ethylene carbonate recycling system using ozone treatment, similar to the system shown in FIG. 2 of the example 5, is presented in FIG. 5. In this recycling system, the construction of the gas treatment vessel 56 and the recycled liquid vessel 67 are almost identical with that shown in FIG. 2, and the respective capacity of these vessels must be at least the capacity of the vessel 100 in the case of the gas treatment vessel 56, and at least twice that capacity in the case of the recycled liquid vessel 67. The vessel 67 contains approximately 4 L of ethylene carbonate liquid which has been previously transferred from the liquid storage tank via a valve 113 and a liquid supply pipe 114, and this liquid is heated and maintained at 80° C.

In the same manner as the example 10, once the treatment liquid has treated 6 lots of 8 wafers, a valve 37 is opened, and the liquid is cooled to approximately 40° C. through the action of a waste liquid cooler 54 and transferred to the vessel 56. Heated liquid from the vessel 67 is supplied to the empty vessel 100 through a liquid transport pump P and a fluororesin precision filter F, and at the same time, the valve 20 is opened and approximately 200 mL of fresh ethylene carbonate liquid is added to the vessel 101. The liquid in the vessel 100, which will have increased in volume with the movement of liquid from the ozone degassed vessel 106, is then adjusted to a temperature of 80° C. using the heater 12. Subsequently 6 lots, each containing 8 wafers with the same specifications as those of the example 10, were treated in the same manner as above. The ethylene carbonate liquid inside the vessel 56 is maintained at approximately 40° C., and high concentration ozone gas is then bubbled through the liquid for 5 minutes at a flow rate of 2 L/minute. This treatment causes decomposition of the dissolved resist, and the liquid changes from a deep brown color to a transparent pale blue. Any fine particles of hardened resist are also decomposed and eliminated. High purity nitrogen gas is then bubbled through the liquid for one minute at the same flow rate to remove the ozone, and the liquid is then transferred to the vessel 67 by a liquid transport pump. The liquid in the vessel 67 is then heated to 80° C. within a 5 minute period. When 6 treatment lots of 8 wafers have been completed in the vessel 100, the treatment liquid is transferred to the vessel 56 in the same manner as described above, and 3 L of liquid at 80° C. is pumped from the vessel 67 into the vessel 100. This sequence of processes is then repeated. When 16 occurrences of the 6 treatment lots of 8 wafers have been completed, that is after the treatment of 768 wafers, the approximately 7 L of liquid in the vessel 67 and the approximately 3 L of liquid in the vessel 56 is discharged to waste. Pure ethylene carbonate liquid can be efficiently recovered from this waste liquid by vacuum distillation.

The final 8 wafers subjected to stripping were subjected to both naked eye inspection and determination of the residual organic carbon on the surface using charged particle radioactivation analysis, any there were no significant differences from the results of the example 10, indicating satisfactory stripping. Accordingly, using this series of treatments, each 1 L of ethylene carbonate liquid was able to be used for stripping 77 wafers. In contrast, in conventional organic solvent treatments, 3 L of solvent is required for stripping 8 wafers×6 lots=48 wafers, or in other words, a stripping performance of 16 wafers per 1 L of liquid. Consequently, the quantity of stripping treatment liquid required in this example is approximately ⅕th that of conventional treatments.

Example 13

Although semiconductor resists are increasing in purity, they still contain large amounts of impurities when compared with ultra high purity chemicals used for cleaning. Consequently, if the number of times that a stripping liquid is used for treatment is increased five fold over conventional treatments, as in the previous example, then in the final stripping treatment process, the concentration of impurities in the liquid will have risen to 5 times that of a conventional treatment liquid, increasing the danger of contamination of the stripped surface with impurities. In order to investigate how impurities within ethylene carbonate liquid adhere to a stripped surface, a radiochemical tracer method was employed with a Si device, using labeling with the radioactive isotope $^{59}$Fe of Fe, which represents one of the most harmful heavy metals. As a result, it was discovered that an Fe concentration of 50 ppb in the liquid lead to Fe contamination of (2.7 to 6.6)$\times10^{10}$ atoms/cm$^2$ on the silicon surface, and (8 to 21)$\times10^{10}$ atoms/cm$^2$ on an oxide film. In order to reduce this contamination to a level of not more than $10^9$ atoms/cm$^2$, the Fe concentration within the ethylene carbonate liquid must be restricted to not more than 1 ppb and 0.5 ppb respectively. If a resist film contains Fe impurities at a level of 1 ppm, then in the previous example in which 768 wafers were treated, Fe impurities would total 20 μg, and if this quantity of Fe exists within 10 L of liquid, then the Fe concentration derived from the resist will total 2 ppb. Accordingly, the calculated quantity of Fe permitted within a resist is 250 ppb.

However, if the ultra pure water rinse following stripping is performed using so-called HF water containing 10 ppm of hydrofluoric acid, then it was found by tracer methods using radioactive isotope labeling that the quantity of adhered contaminants such as Fe, Na, Cr and Ni could be reduced by at least one power of ten. In such a case, impurities of even several ppm in the resist film cease to be a problem.

In contrast, when stripping treatment was attempted with 1% of a carboxylic acid based chelating agent added to the ethylene carbonate liquid or the propylene carbonate, it was evident that in both cases, contamination arising from heavy metal impurities adhering to a silicon surface or an oxide film surface was far less likely. When 50 ppb of $^{59}$Fe labeled Fe was added to ethylene carbonate liquid, and then 1% by weight of tartaric acid was added to the liquid before the liquid was used in a stripping treatment, a similar stripping rate was achieved to a liquid sample containing no added tartaric acid. However, in the case of the tartaric acid containing liquid, tracer methods similar to those described above revealed that the degree of contamination of a stripped oxide film surface due to adhered Fe was only $8\times10^8$ atoms/cm$^2$. Similarly, when 50 ppb of $^{57}$Ni labeled Ni was added to propylene carbonate, and then 1% by weight of citric acid was added to the liquid before the liquid was used in a stripping treatment, once again there was no effect on the stripping rate, and the degree of contamination of a stripped oxide film surface due to adhered Ni was only $2\times10^8$ atoms/cm$^2$. Reducing the effects of contamination of the stripping treatment liquid by using this type of chelate addition is an effective option. The carboxylic acid based chelating agents used in such treatment are comparatively unreactive with respect to ozone dissolved in the alkylene carbonate liquid, and as such are not a significant impediment to the repeated use of the stripping liquid.

Example 14

The widely used batch treatment based multiple tank immersion method comprises a plurality of chemical treatment vessels and a pure water vessel, and the first chemical vessel is usually heated. In this example, treatment was performed with as few alterations as possible to this type of conventional method. A mixed treatment liquid of ethylene carbonate and propylene carbonate according to the present invention was applied to a process for stripping a residual resist film left after ashing with an organic solvent. Because the target for removal was a resist from which the hardened degenerated sections had already been removed, heating the mixed treatment liquid to a temperature of 50 to 60° C. enabled stripping to be completed with ease, and direct rinsing with water also produced no problems. Consequently, a stripping system shown in FIG. 6 was used, using the transport system of the example 10, and with the stripping treatment tact time set to 2 minutes, and otherwise similar to the configuration shown in FIG. 5 with a heated treatment vessel 100 for stripping and a pure water rinse vessel 102. Batch treatment was performed on 25 six inch wafers per lot, and 8 L of liquid in the vessel 100 was sufficient for the treatment.

Figure 6:
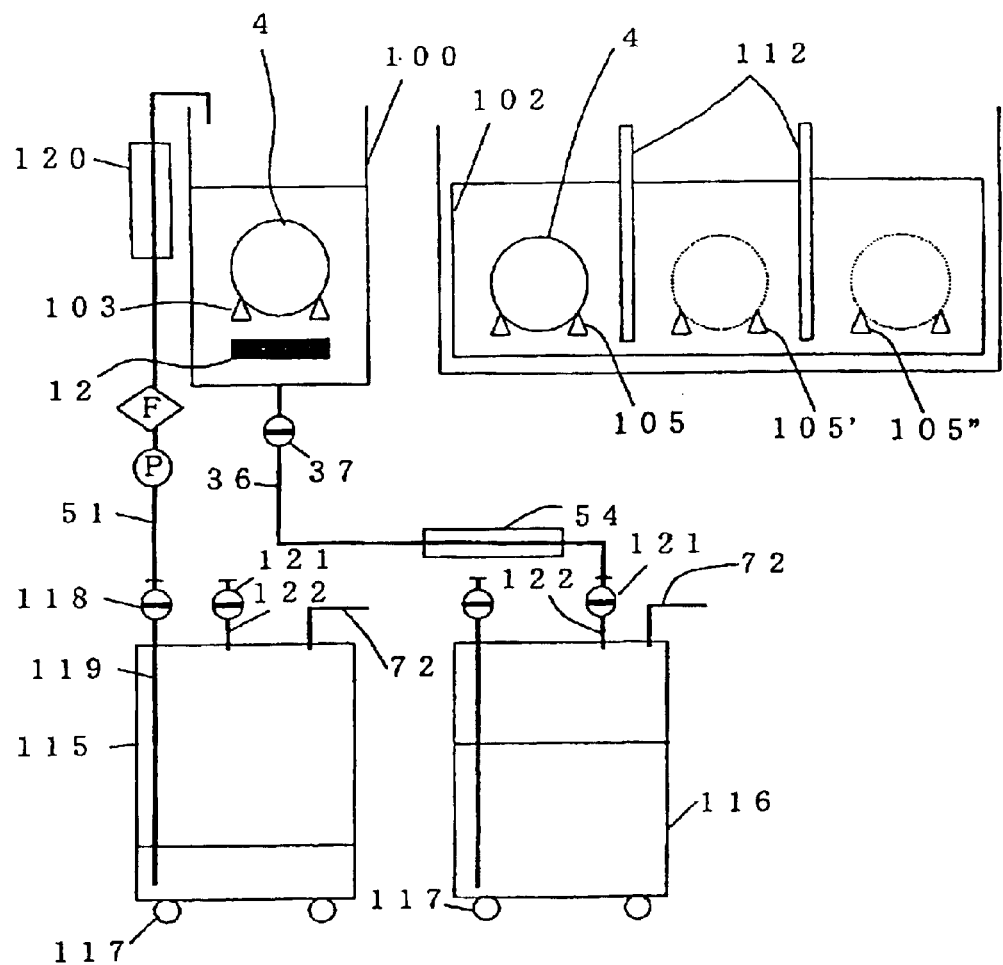
FIG. 6 is a schematic diagram of a treatment apparatus using a mixed liquid of ethylene carbonate and propylene carbonate according to the present invention and employing a batch immersion method.
Figure 6:
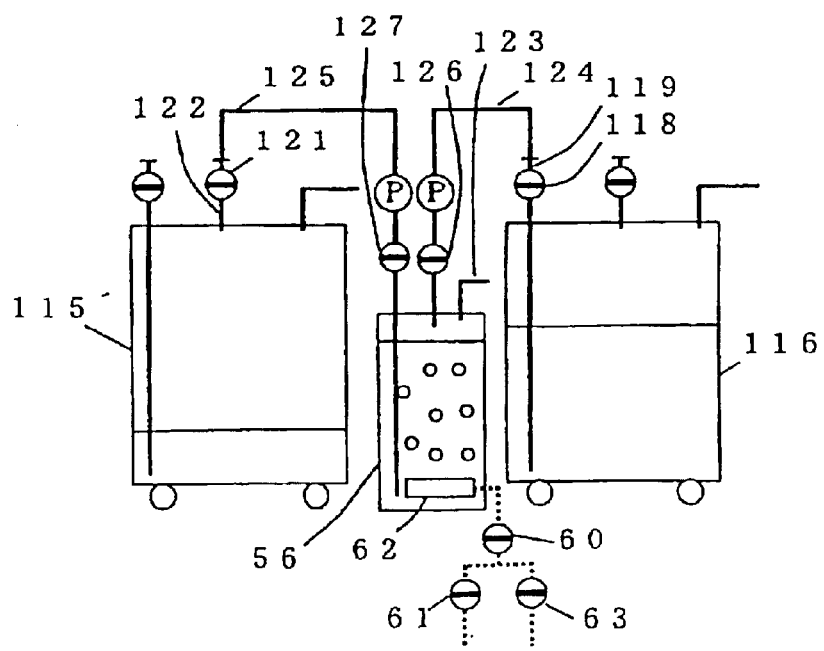

In this example, as was the case above, the stripping liquid in the vessel 100 is changed after treatment of 6 lots, that is every 12 minutes, and consideration was given to the case in which there is insufficient space around the stripping apparatus to enable installation of a mechanism for the decomposition and recycling treatment of this discharged liquid by ozone gas, so that as is shown schematically in FIG. 6, the recycling treatment is performed in a separate location, and perhaps a separate building, from the stripping apparatus.

A mixture of equivalent quantities of ethylene carbonate and propylene carbonate was used as the treatment liquid, although it can be estimated from Table 1 of the example 3 that unless propylene carbonate, which is a liquid even at temperatures below 0° C., is cooled to a temperature below room temperature, then there is no significant reduction in the reaction with ozone. The equivalent mixture is a very usable liquid at room temperature, and on aeration of the mixture with ozone gas at room temperature, reaction with ozone was comparatively weak. If the temperature at which ozone aeration occurs is lowered, then the decomposition effect on the resist weakens, although in this case the treatment target is not a hardened resist, and so satisfactory decomposition can be achieved at lower temperatures, and recycling of the mixed liquid is also possible.

Liquid supply tanks 115, 115' and waste liquid stock tanks 116, 116' each have a capacity of 100 L, and are of identical shape and fitted with casters 117. Initially, the tanks 115, 115' are both filled with fresh treatment liquid, and first, a liquid removal pipe 119 for the tank 115, which is fitted with a valve 118, is connected to the treatment liquid supply pipe 51 of the stripping apparatus. Then, the action of a liquid transport pump P can be used to pump 8 L of treatment liquid through a precision filter F and a water heater 120 and into the vessel 100.

The temperature of the liquid in the vessel 100 is maintained at 50 to 60° C. by the heater 12, and treatment is performed on 6 lots. The tank 116 is initially empty, and a liquid inlet pipe 122 fitted with a valve 121 is connected to the liquid waste pipe 36 of the vessel 100. Following completion of the treatment, the valves 37, 121 are opened and the treatment liquid is discharged into the tank 116. During this discharge process, the cooler 54 cools the liquid down to room temperature. Following the completion of ten 6 lot treatments in 2 hours, the tanks 115 and 116 are exchanged with the tanks 115' and 116' respectively, and lot treatment continues.

The tanks 115, 116 are then transported to the location of the ozone treatment apparatus. The ozone treatment apparatus is based around a gas treatment vessel 56 (with a treatment liquid capacity of 5 L) equipped with a gas diffuser 62 which is connected to an ozone gas generation device (not shown in the diagram) via a valve 61, and to a high pressure nitrogen pipe via a valve 63. Expended gas is transferred to a waste gas treatment facility (not shown in the diagram) via an exhaust gas outlet 123. The liquid removal pipe 119 of the tank 116 is connected to the liquid inlet pipe 124 of the vessel 56, and a liquid removal pipe 125 of the vessel 56 is connected to the liquid inlet pipe 122 of the tank 115, and by operating the valves 118, 126 and a liquid transport pump P, liquid is transferred from the tank 116 to the vessel 56. By opening and closing the valves 60, 61, and 63, first ozone gas of concentration 210 mg/L is bubbled through the liquid for 5 minutes at a flow rate of 4 L/minute, and then nitrogen gas is bubbled through the liquid for one minute at the same flow rate. The resist is totally decomposed, and the liquid changes to a transparent pale blue color. At this point, the valves 127, 121 and a liquid transport pump P are used to transfer the liquid in the vessel 56 to the tank 115. This process is repeated automatically until the tank 116 is empty. Following the completion of ten 6 lot treatments in the stripping vessel 100, the nearly full tank 115 and the empty tank 116 are moved, and exchanged with the tanks 115' and 116' connected to the stripping apparatus. The removed tanks are transported to, and connected to the ozone treatment apparatus, and the process described above is repeated. If the treatment liquid is discharged from both tanks and replaced with fresh liquid after completion of 14 cycles of tank treatment, then this equates to the treatment of 105 wafers with every 1 L of treatment liquid. In comparison with a conventional treatment in which the treatment liquid is discharged and replaced after 6 lots, which equates with slightly under 19 wafers per 1 L of treatment liquid, the quantity of treatment liquid required in this example is approximately ⅕.5, providing a recycling effect of a similar level to the example 12.

Example 15

The fact that ethylene carbonate is not classified as a hazardous material under the Fire Services Act is an advantage, although at room temperature it is a solid, and can be difficult to use in some situations, and consequently, the addition of secondary constituents which enable stripping to be performed at room temperature were investigated. The mixed treatment liquid with propylene carbonate described in the previous example is perhaps the most effective. However, using such a mixed liquid results in an increased cost for chemicals, and in addition, the recovery of the waste liquid by distillation becomes more difficult. In cases in which room temperature treatment is desirable even if the stripping rate falls to 2 to 3 μm/minute, mixtures with water can be considered. To ensure a liquid at 25° C., the proportion of water in such a mixture needs to be at least 20% by weight. Using a resist coated sample with the same specifications as those described in the example 1, ozone addition treatment similar to that described in the example 1 was conducted at 25° C. using ethylene carbonate liquid containing 20% by weight of water. The stripping was satisfactory, and a stripping rate of 4 μm/minute was achieved. When the proportion of water in the mixture was increased to 25% by weight and the temperature was lowered to 20° C. a stripping rate of 2 μm/minute was achieved, although charged particle radioactivation analysis revealed that the quantity of organic carbon on the surface had increased to approximately $5 \times 10^{13}$ atoms/cm$^2$.

If 20% by weight of acetic acid is added to ethylene carbonate then the mixture is a liquid at 25° C., although it solidifies at 20° C. In addition, the flash point also increases significantly, and it can be surmised that such a mixture would not be classified as a hazardous material under the Fire Services Act. Using this composition, a stripping test using ozone addition was conducted at 25° C. in the same manner as that described above. The stripping was satisfactory, and the stripping rate was 10 μm/minute, enabling superior results to conventional immersion treatment in ozone/acetic acid to be achieved.

Example 16

Figure 7:
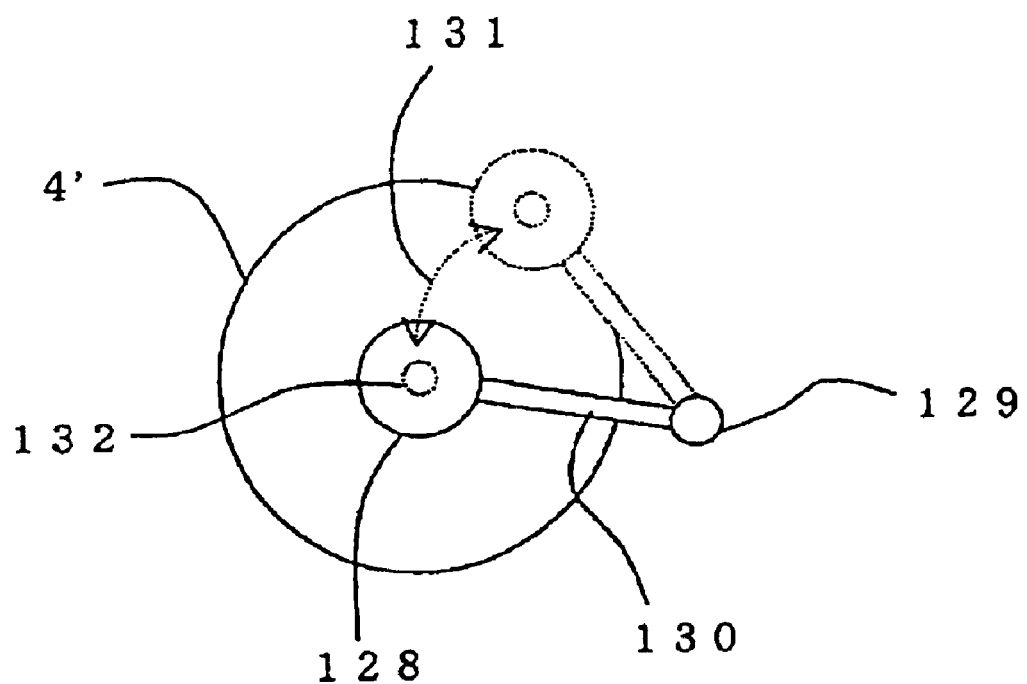
FIG. 7 is an overhead view showing a trace of a nozzle during the back and forth movement of an oscillator.

In the single substrate spin treatment apparatus of the example 5, the nozzle 52 for supplying ethylene carbonate treatment liquid onto the wafer 4' was exchanged with a commercially available 950 KHz ultrasonic spot shower oscillator. In other words, the apparatus was modified so that the discharge of liquid from the nozzle attached to the megasonic oscillator sprayed vertically onto the wafer surface, the distance from the tip of the nozzle to the wafer was 10 mm, and the nozzle itself was able to move across the wafer in an arc from the center of the wafer to the edge of the wafer and back. FIG. 7 is an overhead view showing a trace of the movement of the megasonic oscillator. An oscillator 128 is positioned above a wafer 4' and is connected, via a connection pipe 130, to a rotational axis 129 with the same function as the rotatable supply pipe 78 of the example 7 shown in FIG. 3. A nozzle 132 which moves back and forth along an arc trace 131 supplies treatment liquid onto the wafer 4'.

Using a dry etched novolak resist sample from the example 5, the same 100° C. high purity ethylene carbonate liquid was supplied to the wafer surface under conditions including a rotational speed of 200 rpm, a treatment time of 8 seconds, a flow rate of 1 L/minute, and with megasonic irradiation. During this 8 second treatment period the oscillator was moved so that the nozzle moved back and forth along the designated trajectory, completing one movement cycle across the wafer and back every 2 seconds. The wafer rotational speed was then increased to 1000 rpm, and the same process repeated for a further 2 seconds, and then subsequent treatment was performed in the same manner as the example 5. Inspection of the sample surface under an electron microscope revealed that the resist had been completely removed. The stripping rate for the resist was approximately twice the rate observed when no megasonic irradiation was used. The vapor pressure of ethylene carbonate at 100° C. is 8 mmHg, meaning high frequency ultrasonic processing using a spot shower can be performed at high temperatures.

Example 17

When ethylene carbonate was used for stripping a resist on a metal wiring film, determination of the degree of damage caused to the metal surface was tried based on the elution rate of the metal into the liquid. First, 500 g of high purity ethylene carbonate liquid carefully purified by distillation was placed in a dish of high purity quartz glass, forming a depth of liquid of approximately 10 mm, and the temperature of the liquid was maintained at 120° C. Next, a sample comprising a film of Al of thickness 1000 Å formed on an eight inch silicon wafer was immersed in the liquid in the dish, with the metal surface facing upward. After immersion for 10 minutes, a portion of the liquid was withdrawn and subjected to ICP mass spectrometry to determine the quantity of eluted Al. The surface of the metal following treatment was also inspected under a microscope, but no pit shaped regions of localized corrosion were visible, indicating that any elution was probably occurring reasonably uniformly across the entire surface. On this assumption, the average elution rate was determined, but the result was less than the detection limit of 0.03 Å/minute. Using the same procedure, it was determined that the elution rate for Cu was less than 0.01 Å/minute, and the elution rate for W was 0.035 Å/minute. Accordingly, for those metals which are easily damaged by heat treatment with conventional organic solvents, high temperature treatment with ethylene carbonate poses no problems whatsoever.

According to the present invention, by using a treatment liquid formed from liquid ethylene carbonate and/or propylene carbonate, and in particular such a treatment liquid containing dissolved ozone gas, organic films on substrate surfaces, such as dry etched resist films and the like which have conventionally required ashing, can be effectively removed in an extremely short period of time. A treatment liquid according to the present invention displays a high boiling point and a high flash point, and can consequently be applied to treatment under high temperature conditions, producing a considerable improvement in stripping performance. Furthermore, a treatment liquid of the present invention is also very safe, and suffers from little environmental problems. Of particular importance is the fact that this resist removal treatment has no deleterious effects on easily damaged metal substrate films such as Al, Cu or W. In addition, following treatment the liquid can be easily recycled by aerating with ozone gas, enabling reuse of the liquid, which offers obvious economic benefits. Furthermore, if a treatment liquid containing an added carboxylic acid complexing agent is used, then the contamination of a silicon surface with adhered metal impurities can also be prevented.

What is claimed is:

1. An apparatus for removing an organic film from a surface of a substrate comprising:
   (A) a treatment liquid delivery means for transporting a treatment liquid comprising liquid ethylene carbonate, propylene carbonate, or both thereof to a treatment area,
   (B) a film contact means for bringing said treatment liquid into contact with the surface of said organic film of said substrate within said treatment area, (C) a treatment liquid circulation means for recycling the treatment liquid used and discharged from said treatment area back to said treatment area via one or more temporary storage means, and (D) an ozone-containing gas contact means for bringing an ozone-containing gas into contact with said treatment liquid discharged from said treatment area within at least one of said temporary storage means.

2. The apparatus according to claim 1, wherein at least one means of the means (A) to (D) is provided with a heating means.

3. The apparatus according to claim 1, wherein said treatment area comprises a means for immersing a substrate in a treatment liquid.

4. The apparatus according to claim 1, wherein said treatment area comprises a means for applying a treatment liquid to a substrate through a nozzle.

5. The apparatus according to claim 1, wherein said treatment area comprises a means for rotating a substrate about an axis perpendicular to a surface of said substrate.

6. The apparatus according to claim 5, further comprising a nozzle for supplying liquid ethylene carbonate onto a surface of a substrate rotating about said axis to form an ethylene carbonate film on said surface, and a nozzle for projecting cold air onto said surface of said substrate for solidifying said ethylene carbonate liquid film.

7. The apparatus according to claim 5, further comprising a nozzle for supplying a treatment liquid onto a surface of a substrate rotating about said axis, and a nozzle for projecting a high concentration ozone gas onto said surface of said substrate.

8. The apparatus according to claim 1, comprising a means for irradiating high frequency ultrasound through a treatment liquid.

9. The apparatus according to claim 1, wherein said organic film is a resist film.

10. The apparatus according to claim 1, wherein said treatment liquid further comprises an aliphatic carboxylic acid-based complexing agent.

11. The apparatus according to claim 10, wherein said aliphatic carboxylic acid-based complexing agent is tartaric acid, citric acid or oxalic acid.

12. The apparatus according to claim 10, wherein said aliphatic carboxylic acid-based complexing agent is present in a quantity of from 0.03 to 1.5% by weight in said treatment liquid.

* * * * *